US009189201B2

(12) United States Patent
Jacobson et al.

(10) Patent No.: US 9,189,201 B2
(45) Date of Patent: Nov. 17, 2015

(54) ENTROPY SOURCE WITH MAGNETO-RESISTIVE ELEMENT FOR RANDOM NUMBER GENERATOR

(75) Inventors: David M. Jacobson, San Diego, CA (US); Xiaochun Zhu, San Diego, CA (US); Wenqing Wu, Carlsbad, CA (US); Kendrick Hoy Leong Yuen, San Diego, CA (US); Seung H. Kang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 556 days.

(21) Appl. No.: 13/367,322

(22) Filed: Feb. 6, 2012

(65) Prior Publication Data
US 2013/0073598 A1 Mar. 21, 2013

Related U.S. Application Data

(60) Provisional application No. 61/536,769, filed on Sep. 20, 2011.

(51) Int. Cl.
*G06F 7/58* (2006.01)
(52) U.S. Cl.
CPC ..................................... *G06F 7/588* (2013.01)
(58) Field of Classification Search
CPC ................................. G06F 7/58; G06F 7/588
USPC .................................. 708/250, 251, 254, 255
See application file for complete search history.

(56) References Cited

U.S. PATENT DOCUMENTS 6,246,970 B1 * 6/2001 Silverbrook et al. .......... 702/117
6,480,072 B1   11/2002 Walsh et al.
7,571,199 B1   8/2009 Field et al.
(Continued)

FOREIGN PATENT DOCUMENTS

JP  2008310403 A  12/2008
JP  2011013901 A  1/2011
(Continued)

OTHER PUBLICATIONS

Bucci M et al., "Fully Digital Random Bit Generators for Cryptographic Applications", IEEE Transactions on Circuits and Systems I : Regular Papers, vol. 55, No. 3, Apr. 2008, pp. 861-875, XP011333073.
(Continued)

*Primary Examiner* — Chuong D Ngo
(74) *Attorney, Agent, or Firm* — Won Tae Kim

(57) ABSTRACT

An entropy source and a random number (RN) generator are disclosed. In one aspect, a low-energy entropy source includes a magneto-resistive (MR) element and a sensing circuit. The MR element is applied a static current and has a variable resistance determined based on magnetization of the MR element. The sensing circuit senses the resistance of the MR element and provides random values based on the sensed resistance of the MR element. In another aspect, a RN generator includes an entropy source and a post-processing module. The entropy source includes at least one MR element and provides first random values based on the at least one MR element. The post-processing module receives and processes the first random values (e.g., based on a cryptographic hash function, an error detection code, a stream cipher algorithm, etc.) and provides second random values having improved randomness characteristics.

19 Claims, 12 Drawing Sheets

(56) References Cited

U.S. PATENT DOCUMENTS

| | | | |
|---|---|---|---|
| 7,728,622 | B2 | 6/2010 | Chua-Eoan et al. |
| 2006/0173943 | A1 | 8/2006 | Luzzi et al. |
| 2008/0010331 | A1* | 1/2008 | Janke et al. ............... 708/250 |
| 2009/0265112 | A1 | 10/2009 | Wilber et al. |
| 2010/0109660 | A1 | 5/2010 | Wang et al. |
| 2010/0131578 | A1 | 5/2010 | Fukushima et al. |
| 2010/0174766 | A1 | 7/2010 | Weeks et al. |
| 2010/0238700 | A1 | 9/2010 | Li et al. |
| 2011/0123022 | A1 | 5/2011 | Oishi et al. |
| 2011/0302232 | A1* | 12/2011 | Vasyltsov et al. ............. 708/251 |
| 2012/0026784 | A1 | 2/2012 | Kanai et al. |

FOREIGN PATENT DOCUMENTS

| | | |
|---|---|---|
| TW | 200635319 A | 10/2006 |
| TW | 200826598 A | 6/2008 |
| WO | 2008152845 A1 | 12/2008 |
| WO | 2010090328 A1 | 8/2010 |

OTHER PUBLICATIONS

Cockburn B F "Tutorial on magnetic tunnel junction magnetoresistive random-access memory", MTDT' 04, Aug. 9, 2004-Aug. 10, 2004, pp. 46-51, XP010718727.

International Search Report and Written Opinion—PCT/US2012/055785—ISA/EPO—Apr. 12, 2013.

Menezes A.J., et al.,"Handbook of Applied Cryptography", 1997, CRC Press, Boca Raton, FL, USA228210, XP002178884, ISBN: 978-0-8493-8523-0, pp. 171-173.

Partial International Search Report—PCT/US2012/055785—ISA/EPO—Feb. 1, 2013.

Schneier B., "Applied Cryptography, Second Edition", 1996, John Wiley & Sons, Inc, New York, NY, USA, XP002260802, ISBN: 978-0-471-11709-4, pp. 421-428.

Tanamoto, Tetsufumi, et al.; "High Speed MagnetoresistiveRandom-Access memory Random Number Generator Using Error-Correcting Code"; Japanese Journal of Applied Physics 50 (2011) 04DM01; 5 pgs.

Taiwan Search Report—TW101134319—TIPO—Nov. 27, 2014.

Fukushima A., et al., "Spin Dice: A Physical Random Number Generator Using a Tunnel Magnetic Junctions," Symposium on Cryptography and Information Security 2010 SCIS2010 [CD-ROM], The Institute of Electronics, Information and Communication Engineers, Jan. 19, 2010, 6 pages.

Fukushima A., et al., "Random number generator by current induced magnetization switching", Proc.70th (2008) National Convention (3) Network Security, Japan, Information Processing Society of Japan, Mar. 13, 2008, pp. 359-360.

Kiyomoto, Shinsaku, et al., "A Word-Oriented Stream Cipher using Clock Control," KDDI R&D Laboratories Inc. & Dept. of CSCE, Kyushu University, pp. 1-14, 2007.

* cited by examiner

US 9,189,201 B2

ENTROPY SOURCE WITH MAGNETO-RESISTIVE ELEMENT FOR RANDOM NUMBER GENERATOR

The present application claims priority to provisional U.S. Application Ser. No. 61/536,769, entitled "ENTROPY SOURCE WITH STT-MTJ SEMICONDUCTOR DEVICE FOR RANDOM NUMBER GENERATOR," filed Sep. 20, 2011, and incorporated herein by reference in its entirety.

BACKGROUND

I. Field

The present disclosure relates generally to electronics circuits, and more specifically to techniques for generating random values.

II. Background

Random number (RN) generators are widely used to generate random values for various applications. For example, a computer-like device that implements a cryptographic security algorithm typically needs a source of random values (usually random binary bits). A RN generator may be used to provide random values to the computer-like device for the cryptographic security algorithm. A RN generator is also commonly referred to as a RNG or a random bit generator (RBG).

A RN generator may be implemented with an entropy source that can provide a sequence of random bits. The entropy source may be implemented with a physical device having state transitions that can be modeled by a simple first-order Markov process to the most extent, so that entropy quality and related security strength can be more easily quantified to ensure sufficient security strength. Random bits may be derived from a sequence of state transitions of the physical device. However, most physical devices that can be used for an entropy source are expensive, require high power, and generate data slowly. Furthermore, it may be difficult or impractical to model the state transitions of these physical devices as simple Markov process, which may make it more difficult to quantify the performance of the physical devices.

SUMMARY

An entropy source and a RN generator that can generate random values based on one or more magneto-resistive (MR) elements are described herein. In one aspect, a low-energy entropy source may include a MR element and a sensing circuit. The MR element may be applied a static current (and no current pulses) and may have a variable resistance determined based on magnetization of the MR element. A static current is a current of constant amplitude and polarity, e.g., no current pulses. The MR element may spontaneously and randomly transition between different magnetization states, and these transitions may affect the resistance of the MR element. The sensing circuit may sense the resistance of the MR element and provide random values based on the sensed resistance of the MR element.

In another aspect, a RN generator may include an entropy source and a post-processing module. The entropy source may include at least one MR element and may provide first random values based on the at least one MR element. The post-processing module may receive and process the first random values (e.g., based on a cryptographic hash function, an error detection code, a stream cipher algorithm, etc.) and provide second random values having improved randomness characteristics.

In yet another aspect, an entropy source may include an array of MR cells and a sensing circuit. The array of MR cells may be arranged in a plurality of rows and a plurality of columns. Each MR cell may comprise at least one MR element. A plurality of word lines may be coupled to the plurality of rows of MR cells. A plurality of select lines may be coupled to the plurality of columns of MR cells. A plurality of bit lines may also be coupled to the plurality of columns of MR cells. The sensing circuit may be coupled to the plurality of select lines and may sense the resistance of the MR cells in the array. The MR cells in the array may be selected (e.g., in an interleaved manner) and sensed at a first rate to generate random values at a second rate, which may be higher than the first rate.

In yet another aspect, a tamper detection module may include an entropy source and a detection module. The entropy source may include at least one MR element and may provide first values based on the at least one MR element. The detection module may receive and process the first values and provide an indication of tampering with the entropy source. The detection module may detect tampering with the entropy source based on various criteria such as percentage of zeros and percentage of ones in the first values, or runs of zeros and runs of ones in the first values, or the number of occurrences of predetermined patterns of zeros and ones in the first values, or an output rate of compression of the first values, etc.

Various aspects and features of the disclosure are described in further detail below.

DETAILED DESCRIPTION

An entropy source and a RN generator that can generate random values based on one or more MR elements are disclosed herein. A MR element is an element having a resistance that changes with its magnetization. A MR element may be a magnetic tunnel junction (MTJ) semiconductor device, a spin torque transfer magnetic tunnel junction (STT-MTJ) semiconductor device, or some other device with variable resistance versus magnetization. A STT-MTJ device is a MTJ device that is programmed/written by passing a current through the device (instead of programmed with magnetic field like other MTJ devices). The use of a MR element (e.g., a STT-MTJ device) for an entropy source may provide certain advantages such as ease of fabrication, low cost, good performance, and ability to quantify entropy and security strength.

An entropy source and a RN generator may be used for various electronics devices such as wireless devices, cellular phones, smart phones, tablets, personal digital assistants (PDAs), laptop computers, desktop computers, netbooks, smartbooks, etc. An entropy source and a RN generator may also be used for various applications such as cryptography, a noise source (e.g., for test equipment), sequence generation for probabilistic logic (e.g., sequences representing stochastic variables), Monte-Carlo simulations, optimization problems, genetic algorithms, etc.

Figure 1:
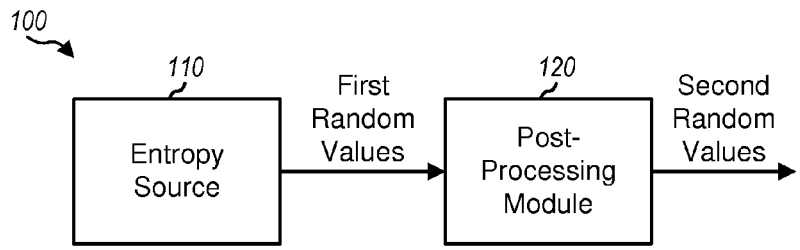
FIG. 1 shows a block diagram of a RN generator.

FIG. 1 shows a block diagram of a design of a RN generator 100. In this design, RN generator 100 includes an entropy source 110 and a post-processing module 120. Entropy source 110 includes one or more MR elements (e.g., one or more STT-MTJ devices) and generates first random values, which may be random bits of '1' or '0'. The terms "random" and "unpredictable" may be used interchangeably. In the design shown in FIG. 1, post-processing module 120 receives the first random values from entropy source 110 and generates second random values that more closely match (statistically) the random values from a true random source. The post-processing by module 120 may improve randomness properties. The second random values may be binary values or non-binary values. In another design that is not shown in FIG. 1, the first random values may be provided directly as the second random values without any post-processing. In this design, the RN generator would include only entropy source 110.

In one aspect, a low-energy entropy source may include one or more MR elements that operate based on a static current (e.g., a low DC current). The static current may also be referred to as sensing current and may be less than an amount of current typically needed to switch the state of a MR element. Current pulses are not applied to the one or more MR elements to induce changes in resistance. Rather, changes in resistance of the MR element(s) due to thermal noise and/or other phenomenon are detected and used to generate random values. Using static current for the MR element(s) may provide various advantages such as low power consumption, simplified circuit design, etc. The low-energy entropy source uses low-energy phenomena (e.g., thermal noise) to generate entropy whereas a high-energy entropy source uses higher energy stimuli (e.g., current pulses) to generate entropy. The low-energy entropy source may generate entropy of suitable quantity and quality, which may be comparable to the entropy from a high-energy entropy source.

Figure 2A:
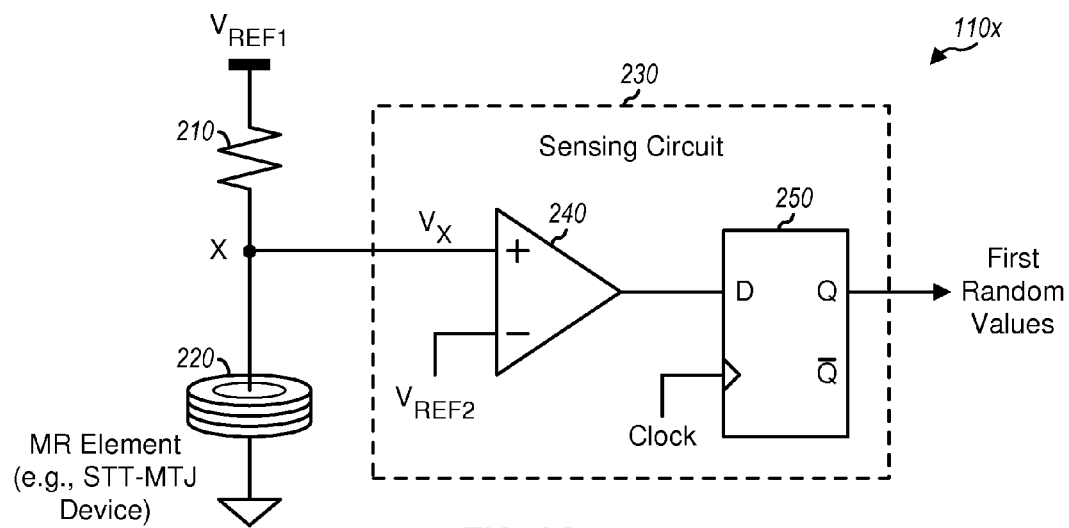
FIGS. 2A and 2B show two designs of a low-energy entropy source.

FIG. 2A shows a schematic diagram of a low-energy entropy source 110x, which is one design of entropy source 110 in FIG. 1. Entropy source 110x includes a resistor 210, a MR element 220, and a sensing circuit 230. Resistor 210 has one end coupled to a first reference voltage ($V_{REF1}$) and a second end coupled to node X. Resistor 210 may also be coupled to a power supply voltage ($V_{DD}$) instead of the $V_{REF1}$ voltage. MR element 220 has one end coupled to node X and the other end coupled to circuit ground. Sensing circuit 230 includes a sense amplifier 240 (e.g., a comparator) and a D flip-flop 250. Sense amplifier 240 has its non-inverting input coupled to node X, its inverting input receiving a second reference voltage ($V_{REF2}$), and its output coupled to the D input of flip-flop 250. Flip-flop 250 also receives a clock at its clock input and provides first random values (e.g., random bits) at its Q output. An advantage of using flip-flop 250 is that all transitions of the output of the flip-flop are synchronized with the clock.

MR element 220 may comprise a STT-MTJ device or some other type of MR element. A STT-MTJ device is formed by a sandwich of two layers of magnetic material with a magnetic tunneling layer in the middle. Two electrical conductors are connected to the two layers of magnetic material. The resistance of the STT-MTJ device is variable and depends on the relative magnetization of the two layers. One of the two layers of magnetic material typically has fixed magnetization (spin polarization) and may be referred to as a fixed layer. The other of the two layers of magnetic material may be switched and may be referred to as a free layer. The relative magnetization of the two layers may switch spontaneously (e.g., due to thermal noise/energy) even when no driving current is applied. The resistance of the STT-MTJ device depends on the relative magnetization of the two layers.

In the design shown in FIG. 2A, a resistive voltage divider is used to sense the resistance of MR element 220. In particular, the voltage at node X ($V_X$) is dependent on a fixed resistance $R_1$ of resistor 210, a variable resistance $R_2$ of MR element 220, and the $V_{REF1}$ voltage applied to the resistive voltage divider. The $V_X$ voltage may be expressed as:

$$V_X = V_{REF1} \times \frac{R_2}{R_1 + R_2}. \quad \text{Eq (1)}$$

As shown in equation (1), when the $R_2$ resistance of MR element 220 changes due to spontaneous switching of the relative magnetization of the two layers of magnetic material, the $V_X$ voltage also changes correspondingly. Sense amplifier 240 compares the $V_X$ voltage against the $V_{REF2}$ voltage, provides a high output voltage if the $V_X$ voltage is higher than the $V_{REF2}$ voltage, and provides a low output voltage otherwise. The $R_1$ resistance of resistor 210, the $V_{REF1}$ voltage, and/or the $V_{REF2}$ voltage may be selected such that the $V_X$ voltage is near the $V_{REF2}$ voltage when the resistance of MR element 220 is at a target value.

Sense amplifier 240 can sense the resistance of MR element 220 and provide binary output values based on the sensed resistance. The binary output values from sense amplifier 240 are sampled by flip-flop 250 based on the clock to obtain first random values. Sampling the output values from sense amplifier 240 with flip-flop 250 may ensure conformance with setup times and hold times of subsequent digital circuits.

The design in FIG. 2A detects changes in the resistance of MR element 220 based on low-energy phenomena. In particular, the resistance of MR element 220 changes due to free oscillation without any driving current. This design may result in a relatively simple circuit for entropy source 110x. This design may also mitigate wear out and improve reliability of MR element 220. A MR element may also be designed and fabricated such that it can more readily undergo spontaneous state switch under agitation from thermal noise and/or other sources of energy. For example, a STT-MTJ device may be implemented with weak retention and/or with no stable axis so that it can undergo spontaneous state switch.

Figure 2B:
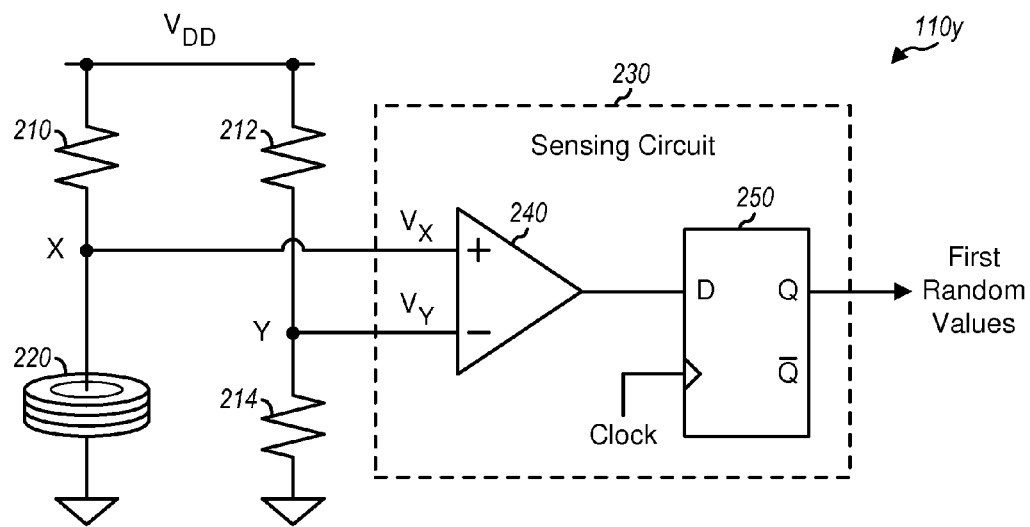

FIG. 2B shows a schematic diagram of a low-energy entropy source 110y, which is another design of entropy source 110 in FIG. 1. Entropy source 110y includes resistor 210, MR element 220, and sensing circuit 230, which are coupled as described above for FIG. 2A, albeit with resistor 210 being coupled to the $V_{DD}$ voltage instead of the $V_{REF1}$ voltage. Entropy source 110y further includes a voltage divider formed by resistors 212 and 214. Resistor 212 is coupled between the $V_{DD}$ voltage and node Y. Resistor 214 is coupled between node Y and circuit ground. Sense amplifier 240 has its non-inverting input coupled to node X, its inverting input coupled to node Y, and its output coupled to the D input of flip-flop 250. Flip-flop 250 also receives a clock at its clock input and provides the first random values (e.g., random bits) at its Q output.

FIG. 2B uses a bridge circuit to measure the resistance of MR element 220. The bridge circuit allows sense amplifier 240 to compare the voltage at node X against the voltage at node Y. Hence, $V_{REF1}$ and $V_{REF2}$ reference voltages are not needed to sense the impedance of MR element 220, which may simplify circuit design.

FIGS. 2A and 2B show two designs of sensing the variable resistance of MR element 220 using a resistive voltage divider. The variable resistance of MR element 220 may also be sensed in other manners. In another design, a current source may apply a static current to MR element 220 (e.g., with resistor 210 omitted). The $V_X$ voltage at node X would then be dependent on the static current (which is known) and the resistance of MR element 220 (which is being measured). In yet another design, another resistor may be connected in series with MR element 220, and a voltage may be applied to the series combination. The voltage across one of the elements (the MR element or the resistor) may be sensed. In yet another design, MR element 220 may be placed in a "bridge" circuit, which may be any of the bridge circuits known by one skilled in the art. The bridge circuit may avoid the need for a reference voltage (e.g., the $V_{REF2}$ voltage in FIG. 2A).

In yet another design, a second MR element may be coupled to the inverting input of sense amplifier 240 and may be used to generate the reference voltage. A resistor may be coupled between the second MR element and a supply voltage, or a current source may provide a static current to the second MR element. MR element 220 coupled to the non-inverting input and the second MR element coupled to the inverting input of sense amplifier 240 may have different designs, different shapes, different sizes, different thickness, and/or other characteristics that are different in order to provide good matching and better tracking for the reference voltage.

In general, the resistance of MR element 220 may be measured by (i) passing a current through the MR element and sensing the voltage or (ii) applying a voltage to the MR element and sensing the current. For option (i), a small amount of current may be used to sense the impedance (and hence the state) of MR element 220. This small amount of current may be well below the amount needed to probabilistically flip the magnetization of MR element 220. The total magnetic moment of MR element 220 may also be measured.

FIGS. 2A and 2B show two designs of a low-energy entropy source with a single MR element 220. In general, a low-energy entropy source may include any number of MR elements, which may be coupled in any manner. In one design, multiple MR elements may be coupled in series. In another design, multiple MR elements may be coupled in parallel. The series or parallel combination of MR elements may be coupled between node X and circuit ground. The use of multiple MR elements may (i) improve collection of entropy from more MR elements, (ii) improve integrated circuit (IC) yield with redundant MR elements since the yield on any given MR element will be less than 100%, and (iii) minimally increase cost and circuit/die area since the MR elements are typically small in size.

An entropy source may include one or more MR elements having resistance that can be changed by applying write pulses (e.g., current pulses). In this case, changes in the resistance of the MR element(s) may be detected based on high-energy phenomena. Operating the MR element(s) based on high-energy phenomena may result in more robust operation for the entropy source but may cause faster wear out of the MR element(s).

Figure 3:
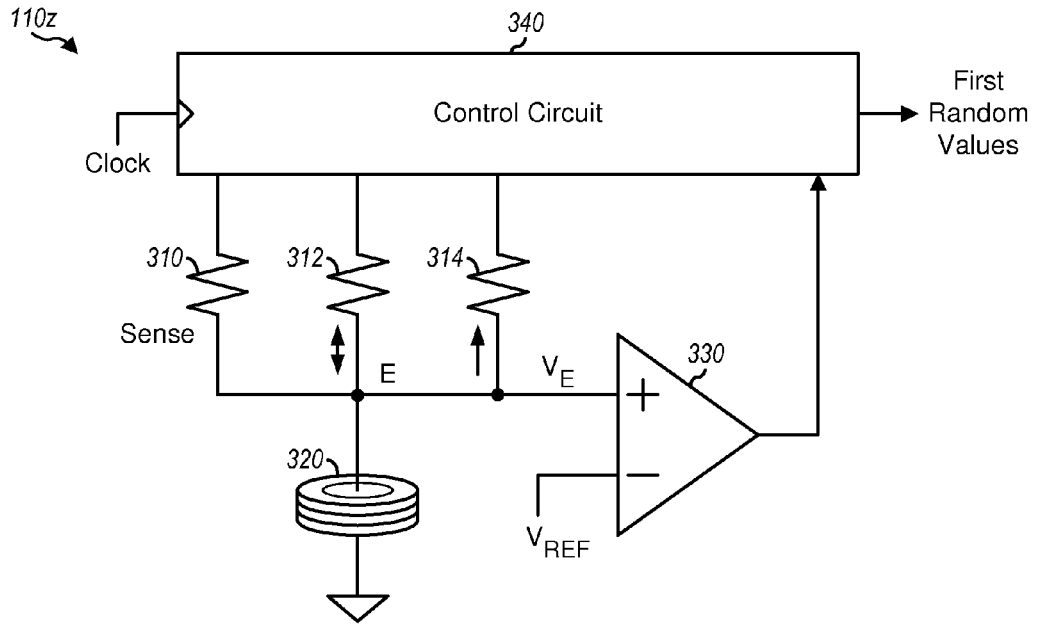
FIG. 3 shows a design of a high-energy entropy source.

FIG. 3 shows a schematic diagram of a high-energy entropy source 110z, which is another design of entropy source 110 in FIG. 1. Within entropy source 110z, resistors 310, 312 and 314 have one end coupled to node E and the other end coupled to three ports of a control circuit 340. A MR element 320 has one end coupled to node E and the other end coupled to circuit ground. A sense amplifier 330 (e.g., a comparator) has its non-inverting input coupled to node E, its inverting input receiving a reference voltage ($V_{REF}$), and its output coupled to an input of control circuit 340. Control circuit 340 also receives a clock at its clock input and provides first random values at its output. In another design, sense amplifier 330 may directly provide the first random values.

Control circuit 340 may generate write pulses to change the state of MR element 320. MR element 320 may be in either state '0' or '1' at any given moment. State '0' may correspond to the resistance of MR element 320 being less than a target value, and state '1' may correspond to the resistance of MR element 320 being greater than the target value.

In general, a pulse may be a current pulse or a voltage pulse and may be of either positive or negative polarity. In one design, control circuit 340 may include (i) a positive pulse generator coupled to resistor 312 via a first switch and (ii) a negative pulse generator coupled to resistor 314 via a second switch. A positive current pulse may be applied to MR element 320 via resistor 312 to flip the state of MR element 320 from '0' to '1'. A negative current pulse may be applied to MR element 320 via resistor 314 to flip the state of MR element 320 from '1' to '0'. A positive pulse may be applied to MR element 320 via resistor 312 by opening the second switch, enabling the positive pulse generator, and closing the first switch. A negative pulse may be applied to MR element 320 via resistor 314 by opening the first switch, enabling the negative pulse generator, and closing the second switch. Resistors 312 and 314 may also be replaced with two current paths. Each pulse generator may generate voltage or current pulses of appropriate amplitude, e.g., current pulses of 100 microamperes (µA) or some other value. The pulses may cause the relative magnetization of the two layers of magnetic material of MR element 320 to change with some probability. A change in the relative magnetization may cause the resistance of MR element 320 to change.

In another design, control circuit 340 may include a single pulse generator. A first set of switches may connect this pulse generator such that it can generate (i) a positive pulse for MR element 320 via resistor 312 or (ii) a negative pulse for MR element 320 via resistor 314. In yet another design, one or more pulse generators may be formed by controlling switches coupled between resistors 312 and 314 and power supply sources. The width of the pulses may be determined by the duration of the switch closures.

In one design, a write pulse may be applied to MR element 320, and the resistance of MR element 320 may be sensed after applying the write pulse. In another design, the resistance of MR element 320 may be sensed, and a write pulse may then be applied to MR element 320 to possibly change its state. In yet another design, the impedance of MR element 320 may be sensed while a write pulse is applied to MR element 320.

Figure 4:
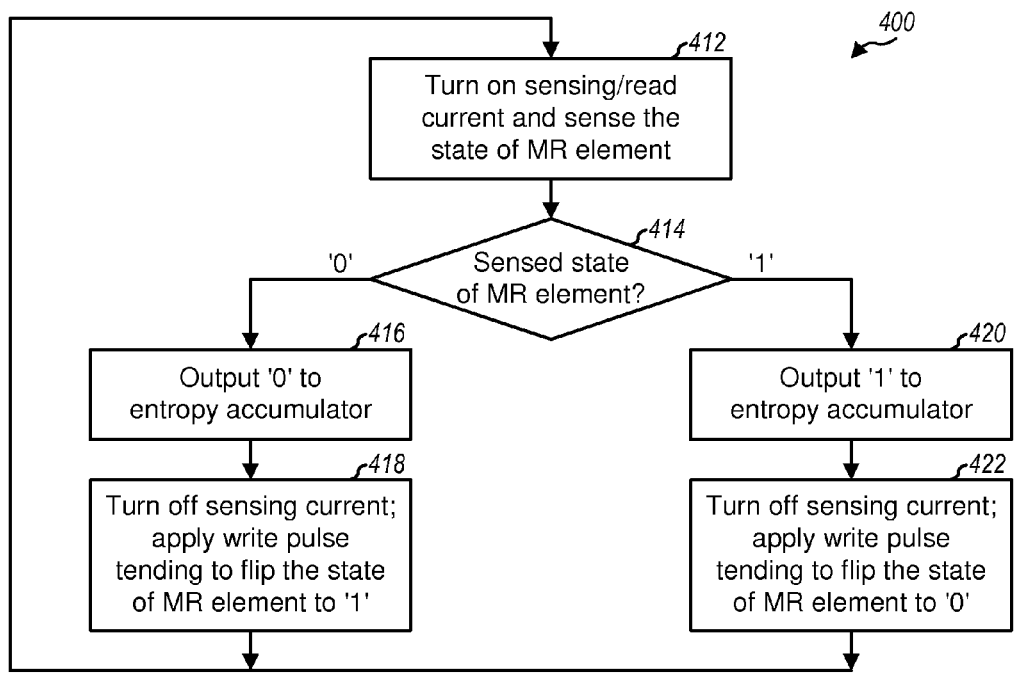
FIG. 4 shows a process performed by a control circuit in FIG. 3.

FIG. 4 shows a flow diagram of a design of a process 400 performed by control circuit 340 in FIG. 3. Initially, a sensing/read current may be turned on via resistor 310 in FIG. 3, and the state of MR element 320 may be sensed by sense amplifier 330 (block 412). A determination may be made whether the sensed state of MR element 320 is '0' or '1' (block 414). If state '0' is sensed in block 414, then a logic '0' may be provided to an entropy accumulator (block 416). The sensing current via resistor 310 may be turned off, and a write pulse (e.g., a positive current pulse) that tends to flip the magnetization of MR element 320 to state '1' may be applied (block 418). Otherwise, if state '1' is sensed in block 414, then a logic '1' may be provided to the entropy accumulator (block 420). The sensing current via resistor 310 may be turned off, and a write pulse (e.g., a negative current pulse) that tends to flip the magnetization of MR element 320 to state '0' may be applied (block 422). The process returns to block 412 after block 418 or 422.

Control circuit 340 in FIG. 3 may be implemented in various manners. In one design, control circuit 340 may include a positive pulse generator coupled to resistor 312, a negative pulse generator coupled to resistor 314, and switches, as described above. The switches may enable and connect either the positive pulse generator or the negative pulse generator to MR element 320 at any given moment. In another design, control circuit 340 may include a single pulse generator whose output may be placed across the two terminals of MR element 320 in a positive or negative manner via switches. In this design, the two terminals of MR element 320 may be placed across the pulse generator, and resistors 312 and 314 may be absorbed into a block containing the pulse generator. In yet another design, a circuit may connect one terminal of MR element 320 to a power supply (e.g., via resistor 310) and may connect the other terminal of MR element 320 to circuit ground. Switching between connection to the power supply or circuit ground may be selected based on whether it is desired to flip MR element 320 to '0' or '1' state.

In one design, entropy source 110z may operate such that each write pulse generated by control circuit 340 for MR element 320 has approximately 50% probability of switching the state of MR element 320. Control circuit 340 may include circuitry to control the amplitude and/or duration of write pulses and/or the amount of time between write pulses to obtain appropriately 50% probability of switching state. For example, a feedback circuit (such as a state machine) within control circuit 340 may average of the number of '0' and '1' values provided by sense amplifier 330 over a sufficiently long time and may adjust the write pulses (e.g., adjust the voltage, current, and/or duration of the write pulses) toward the 50% probability switching point of MR element 320 to obtain a more unbiased output from sense amplifier 330.

In another design, control circuit 340 may apply a series of write pulses to MR element 320 until it toggles state. The number of write pulses applied to toggle the state of MR element 320 may be provided as the first random values. MR element 320 may be reset to an initial state before the series of write pulses is applied.

A resistive voltage divider is formed by resistor 310 having a fixed resistance and MR element 320 having a variable resistance, in similar manner as resistor 210 and MR element 220 in FIGS. 2A and 2B. The resistance of MR element 320 may be sensed by comparing the voltage at node E ($V_E$) against the $V_{REF}$ voltage by sense amplifier 330. The resistance of MR element 320 may also be sensed in other manners. In any case, sense amplifier 330 may provide binary output values based on the sensed resistance of MR element 320. The binary output values from sense amplifier 330 may be sampled by control circuit 340 based on the clock to obtain the first random values.

FIG. 3 shows a design of changing the resistance of MR element 320 with write pulses and sensing the resistance of MR element 320 with a resistive voltage divider. The resistance of MR element 320 may also be changed in other manners. For example, the resistance of MR element 320 may be changed by a strong external magnetic field.

FIG. 3 shows a design of an entropy source with a single MR element 320. In general, an entropy source may include any number of MR elements, which may be coupled in series, in parallel, or in some other manner. The use of multiple MR elements may improve entropy collection as well as IC yield.

Figure 5:
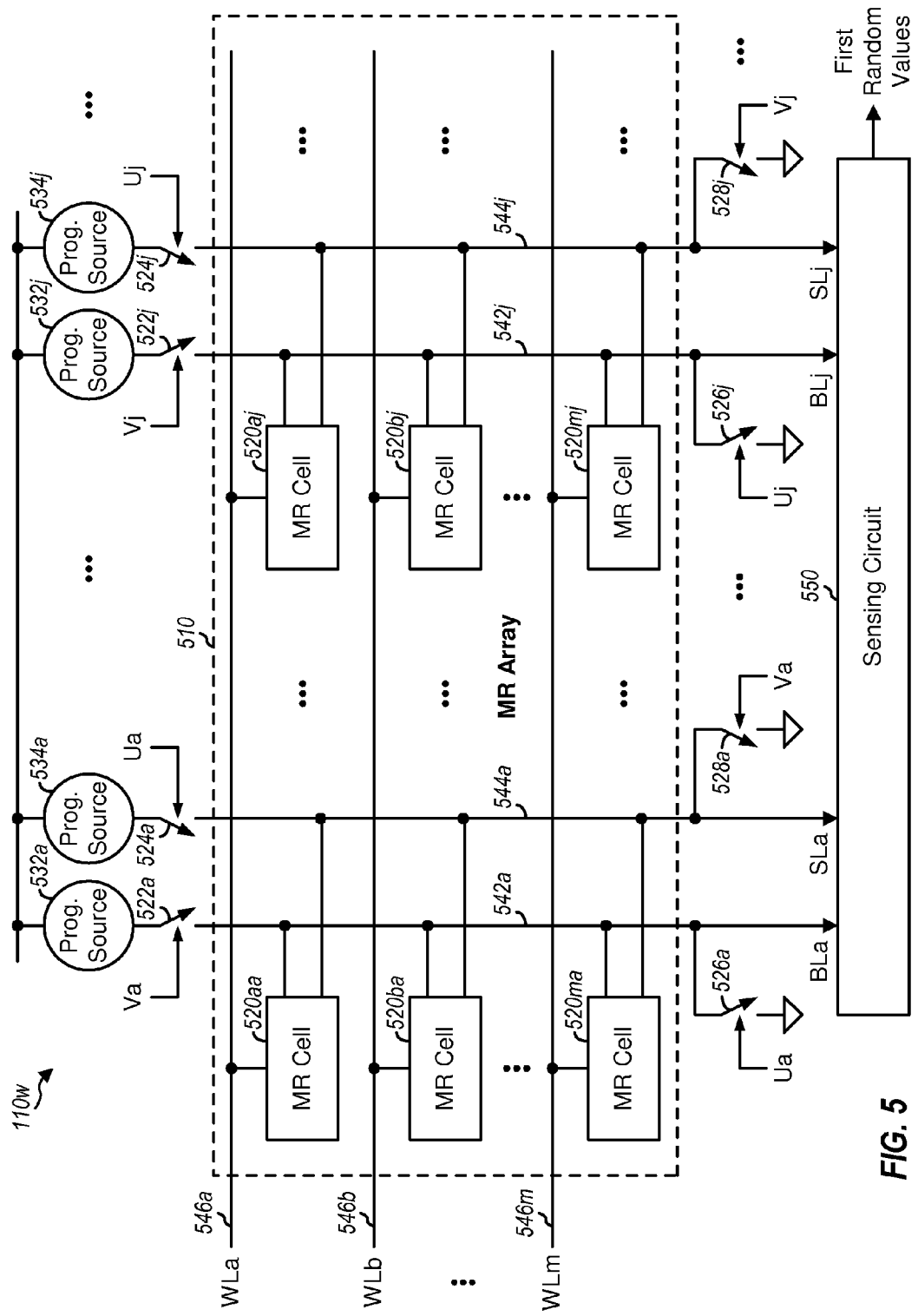
FIG. 5 shows a design of an entropy source with an array of MR cells.

FIG. 5 shows a schematic diagram of an entropy source 110w, which is yet another design of entropy source 110 in FIG. 1. Entropy source 110w includes a M×N array 510 with M rows and N columns of MR cells 520, where in general M>1 and/or N>1. Each MR cell 520 may be implemented based on various designs, as described below. Each column includes M MR cells 520aj to 520mj, switches 522j to 528j, and programming ("Prog.") sources 532j and 534j, where j is a column index and j∈{a, . . . , n}. The M MR cells 520aj to 520mj in each column j are connected to a bit line (BL) 542j and a select line (SL) 544j for that column. The M MR cells 520aj to 520mj in each column j are further connected to M word lines (WL) 546a to 546m, respectively. For each column j, switch 522j is coupled between programming source 532j and a first end of bit line 542j, and switch 524j is coupled between programming source 534j and a first end of select line 544j. For each column j, switch 526j is coupled between a second end of bit line 542j and circuit ground, and switch 528j is coupled between a second end of select line 544j and circuit ground. For each column j, the second end of bit line 542j and the second end of select line 544j are provided to a sensing circuit 550. Sensing circuit 550 can sense the resistance of each MR cell selected by the associated word line and bit line. Sensing circuit 550 provides first random values based on the sensed resistance of the selected MR cells.

For each column j, programming source 532j may be used to change the state of MR cells 520aj to 520mj in column j from '0' to '1'. Programming source 534j may be used to change the state of MR cells 520aj to 520mj from '1' to '0'. Programming sources 532j and 534j may thus be used to write MR cells 520aj to 520mj. In one design, the same programming sources 532j and 534j may be used for both (i) write circuitry used to change the state of MR elements 520aj to 520mj and (ii) read circuitry used to sense the state of MR elements 520aj to 520mj.

Figure 6A:
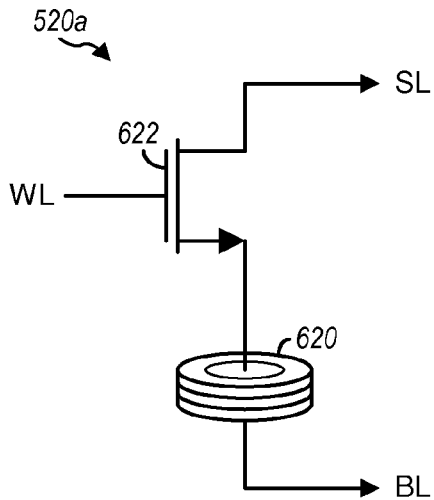
FIGS. 6A, 6B and 6C show three designs of a MR cell.
Figure 6B:
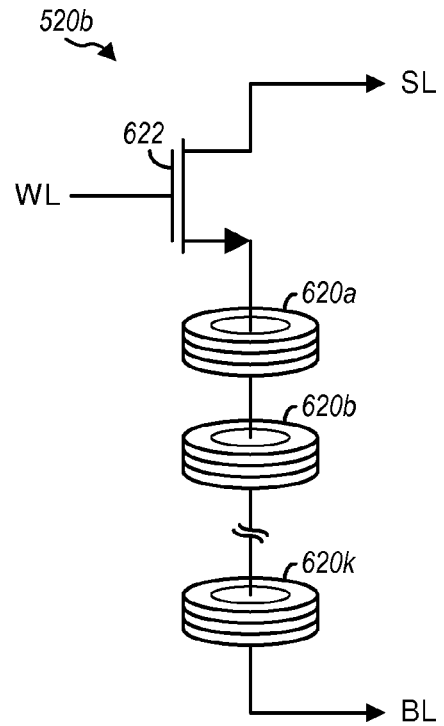
Figure 6C:
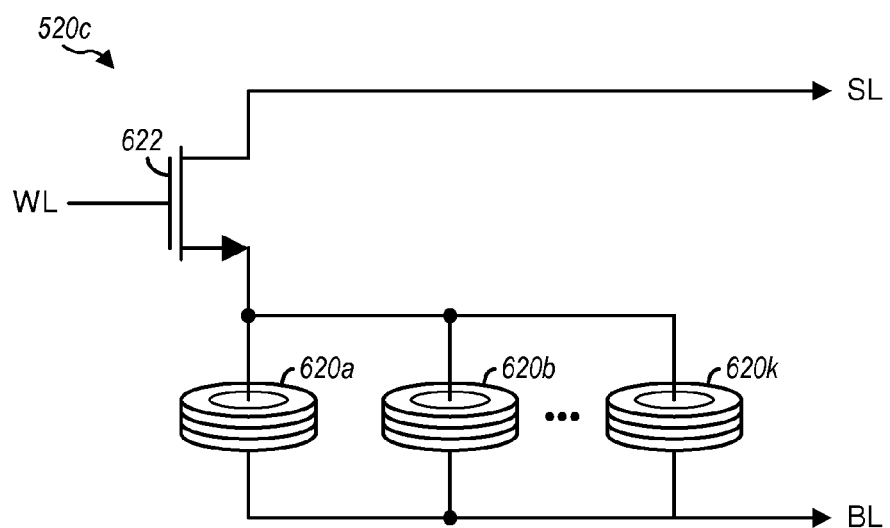

In one design, programming sources 532 and 534 may be current sources, e.g., for MR cells 520 comprising MR elements coupled in series, as shown in FIG. 6B. In another design, programming sources 532 and 534 may be voltage sources, e.g., for MR cells 520 comprising MR elements coupled in parallel, as shown in FIG. 6C.

In one design, programming sources 532 and 534 may be fixed current or voltage sources providing current or voltage pulses of fixed amplitude/magnitude and width. In another design, programming sources 532 and 534 may be configurable current or voltage sources providing current or voltage pulses of adjustable amplitude and/or width. A MR cell may be in either state P or state AP at any given moment. State P may be equivalent of logic "0" of a MR element, and state AP may be equivalent of logic "1" of a MR element. In one design, programming sources 532 and 534 may be independently configured to provide the desired programming of MR cells 520 in two directions—a first direction from state P to state AP and a second direction from state AP to state P.

The probability of switching the state of a given MR cell may be dependent on the amplitude of a programming pulse (e.g., a current pulse or a voltage pulse) applied to the MR cell. A desired/target probability of switching state in the first direction may be obtained by adjusting the amplitude of the programming pulses from programming sources 532. A desired probability of switching state in the second direction may be obtained by adjusting the amplitude of the programming pulses from programming sources 534. For example, a pulse from a programming source 532 may be applied to a first MR cell to cause this MR cell to switch to the AP state with approximately 50% probability. A pulse from a programming source 534 may be applied to a second MR cell to cause this MR cell to switch to the P state with approximately 50% probability. In general, a desired/target probability of switching state in the first or second direction may be obtained by adjusting the amplitude of the programming pulses and/or the duration of the programming pulses.

A programming source 532 or 534 may be configured to provide programming pulses of suitable amplitude that can (i) probabilistically switch the state of a MR cell (e.g., with a probability between 20 to 80%) or (ii) deterministically switch the state of the MR cell (e.g., with a high probability of more than 90%). For example, a programming source 532 or 534 may provide (i) programming pulses of a first amplitude (e.g., 80 μA) for 20% probabilistic switching or (ii) programming pulses of a second amplitude (e.g., 150 μA) for 99% deterministic switching. Programming sources 532 and 534 may allow for desired/optimal probabilistic programming of MR cells in both directions, from state P to state AP and also from state AP to state P.

A MR cell may be probabilistically programmed in either the first or second direction in a single operation, e.g., with a single programming pulse from one programming source 532 or 534. A MR cell may also be probabilistically programmed in multiple operations in order to improve the quality and quantity of entropy from the MR cell. For example, a MR cell may be probabilistically programmed with a first switching probability in a first operation and then with a second switching probability in a second operation. The first and second switching probabilities may or may not be close to a preferred 50% switching probability.

In one design, a MR cell may be programmed as follows. A programming count may be initialized to zero. The MR cell may be read to determine its current state. The MR cell may then be programmed to switch to an opposite state with a particular probability, which may or may not be close to the preferred 50% switching probability. The programming count may then be incremented. If the programming count is less than a total count (e.g., 16), then the MR cell may be programmed once more by repeating the steps described above. In general, the quality of entropy from the MR cell improves for progressively larger total count and progressively more programming operations, even when the switching probability deviates far from the preferred 50% switching probability.

In one design, the first random values from entropy source 110w may be used directly as the second random values. In another design, the first random values from entropy source 110w may be further processed by post-processing module 120 to generate the second random values having better randomness characteristics. In this design, entropy source 110w may be used for entropy generation, and entropy of the desired quality and quantity may be obtained by adjusting the total count.

Entropy source 110w can generate entropy of the desired quality and quantity for a wide range of switching probabilities (e.g., from 1% to 99%) between states. For example, entropy source 110w can generate each random bit with approximately 50% probability of being "0" and approximately 50% probability of being "1" even when the switching probabilities are not close to a preferred 50% switching probability and even when the switching probabilities are unknown as long as they are not 0 or 100%. The total count may be selected to provide entropy of the desired quality and quantity. Entropy source 110w can generate entropy of the desired quality and quantity without having to adjust the amplitude and/or width of the programming pulses from programming sources 532 and 534 to obtain approximately 50% switching probability. The ability to generate random bits having approximately equal probability of being "0" or "1" with a wide range of switching probabilities may be highly desirable since it may be difficult or impractical to obtain 50% switching probability over IC process, voltage, and temperature (PVT) variations.

Switches 522 to 528 in FIG. 5 may be implemented with N-channel metal oxide semiconductor (NMOS) transistors, P-channel metal oxide semiconductor (PMOS) transistors, and/or transistors of other types. For each column j, switches 524j and 526j are controlled by a first control signal Uj for column j, and switches 522j and 528j are controlled by a second control signal Vj for column j.

FIG. 6A shows a design of a MR cell 520a, which may be used for each of the MR cells 520 in FIG. 5. In this design, MR cell 520a includes a single MR element 620 (e.g., a STT-MTJ device) and a NMOS transistor 622. NMOS transistor 622 has its drain coupled to a select line (SL), its gate coupled to a word line (WL), and its source coupled to one terminal of MR element 620. The other terminal of MR element 620 is coupled to a bit line (BL). NMOS transistor 622 may be (i) turned On to connect MR element 620 between the source line and the bit line or (ii) turned Off to disconnect MR element 620 from the source line and the bit line.

FIG. 6B shows a design of a MR cell 520b, which may also be used for each of the MR cells 520 in FIG. 5. In this design, MR cell 520b includes multiple (K) MR elements 620a to 620k coupled in series and NMOS transistor 622. NMOS transistor 622 has its drain coupled to a select line (SL), its gate coupled to a word line (WL), and its source coupled to the terminal for the free layer of the topmost MR element 620a. MR elements 620 may be STT-MTJ devices that may be coupled such that the fixed layer of one STT-MTJ device (e.g., STT-MTJ device 620a) is coupled to the free layer of the next STT-MTJ device (e.g., STT-MTJ device 620b). The terminal for the fixed layer of the bottommost MR element 620k is coupled to a bit line (BL). NMOS transistor 622 may be (i) turned On to connect MR elements 620a to 620k between the source line and the bit line or (ii) turned Off to disconnect MR elements 620a to 620k from the source line and the bit line.

FIG. 6C shows a design of a MR cell 520c, which may also be used for each of the MR cells 520 in FIG. 5. In this design, MR cell 520c includes multiple (K) MR elements 620a to 620k coupled in parallel and NMOS transistor 622. NMOS transistor 622 has its drain coupled to a select line (SL), its gate coupled to a word line (WL), and its source coupled to the terminals for the free layer of the K MR elements 620a to 620k. MR elements 620 may be STT-MTJ devices that may be coupled such that the free layers of all STT-MTJ devices are coupled together and the fixed layers of all STT-MTJ devices are also coupled together. The terminals for the fixed layer of the K MR elements 620a to 620k are coupled to a bit line (BL). NMOS transistor 622 may be (i) turned On to connect MR elements 620a to 620k between the source line and the bit line or (ii) turned Off to disconnect MR elements 620a to 620k from the source line and the bit line.

Referring back to FIG. 5, programming sources 532 and 534 may be current sources if MR cells 520 are implemented with series-coupled MR cell 520b in FIG. 6B. programming sources 532 and 534 may be voltage sources if MR cells 520 are implemented with parallel-coupled MR cell 520c in FIG. 6C.

Entropy source 110w in FIG. 5 may operate as follows. The state of a given MR cell 520ij in row i and column j may be sensed by (i) activating word line WLi for row i to turn on NMOS transistor 622 for MR cell 520ij, (ii) opening switches 522j to 528j for column j, and (iii) sensing the resistance between the BLj and SLj lines. The state of MR cell 520ij may be changed from '0' to '1' by (i) activating word line WLi for row i, (ii) applying programming source 532j for column j to MR cell 520ij, (iii) closing switches 522i and 528i for column j, and (iv) opening switches 524j and 526j for column j. The state of MR cell 520ij may be changed from '1' to '0' by (i) activating word line WLi for row i, (ii) applying programming source 534j for column j to MR cell 520ij, (iii) closing switches 524i and 526i for column j, and (iv) opening switches 522j and 528j for column j. Multiple MR elements in a given column may be sensed concurrently by activating the word lines for these MR elements. Different MR cells 520 may be sensed in different clock cycles by properly activating the control lines for these MR cells.

In one design, a reference array may be used to sense the resistance and state of MR elements 520 in array 510. In one design, the reference array may be similar (e.g., identical) to MR array 510. In another design, the reference array may be different from MR array 510. For example, the MR elements in array 510 may be different from the MR elements in the reference array, e.g., due to different designs, different shapes, sizes, thickness, etc. The reference array may also be implemented with poly resistors instead of MR elements.

An entropy source may include multiple MR elements or cells (e.g., e.g., as shown in FIG. 5) in order to obtain the advantages described above. Such an entropy source may be operated in various manners to improve performance of entropy generation.

In one design, entropy generation rate may be increased by interleaving or multiplexing the outputs of multiple MR elements (e.g., hundreds or thousands of MR elements). For example, a single MR element may be sensed at a rate of 10 MHz and may support an entropy generation rate of 10 MHz. A much higher entropy generation rate of 10 GHz may be achieved by sequentially sensing 1000 MR elements and interleaving the outputs of these MR elements In another design, power consumption and switching current may be reduced by multiplexing the outputs of multiple MR elements. For example, a single MR element may be sensed at a rate of 10 MHz with switching pulses of 100 ns or less to obtain an entropy generation rate of 10 MHz. The same 10 MHz entropy generation rate may be achieved by sequentially sensing 10 MR elements with switching pulses of 1 µs or less and interleaving the outputs of these MR elements. The longer switching pulses may reduce power consumption.

In another aspect, a RN generator may include an entropy source and a post-processing module, e.g., as shown in FIG. 1. The entropy source may generate first random values based on one or more MR elements. The post-processing module may receive the first random values from the entropy source and may generate the second random values having better randomness properties. The post-processing module may be implemented in various manners, and some exemplary designs of the post-processing module are described below.

Figure 7A:
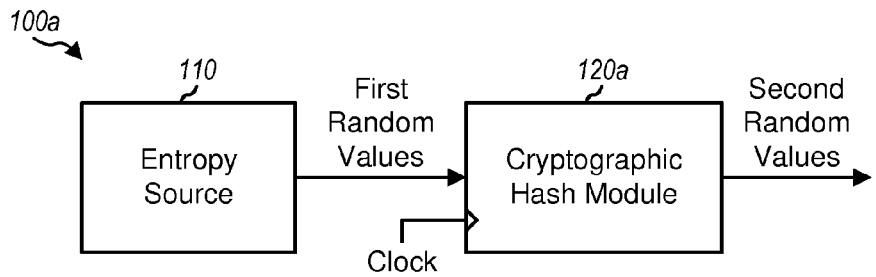
FIGS. 7A to 12 show various designs of a RN generator.

FIG. 7A shows a block diagram of a RN generator 100a, which is one design of RN generator 100 in FIG. 1. In this design, RN generator 100a includes entropy source 110 and a cryptographic hash module 120a, which is one design of post-processing module 120 in FIG. 1. Hash module 120a receives first random values (e.g., random bits) from entropy source 110 and generates second random values. In one design, hash module 120a aggregates each block of L random bits from entropy source 110 to form a L-bit random value, where L may be any suitable integer value. Hash module 120a then hashes a number of L-bit random values based on a cryptographic/secure hash algorithm and provides a N-bit hash value, where N may be any suitable integer value. The N-bit hash value is also commonly referred to as a hash digest and is provided as a second random value. Hash module 120a may implement SHA-1 (Secure Hash Algorithm), SHA-2 (which includes SHA-224, SHA-256, SHA-384 and SHA-512), MD-4 (Message Digest), MD-5, or some other secure hash algorithm known in the art. A secure hash algorithm has cryptographic properties so that the function between an input message and its digest is irreversible and the likelihood of two input messages mapping to the same digest is very small. A secure hash algorithm may receive an input message of any length and may provide a hash digest of a fixed length.

Figure 7B:
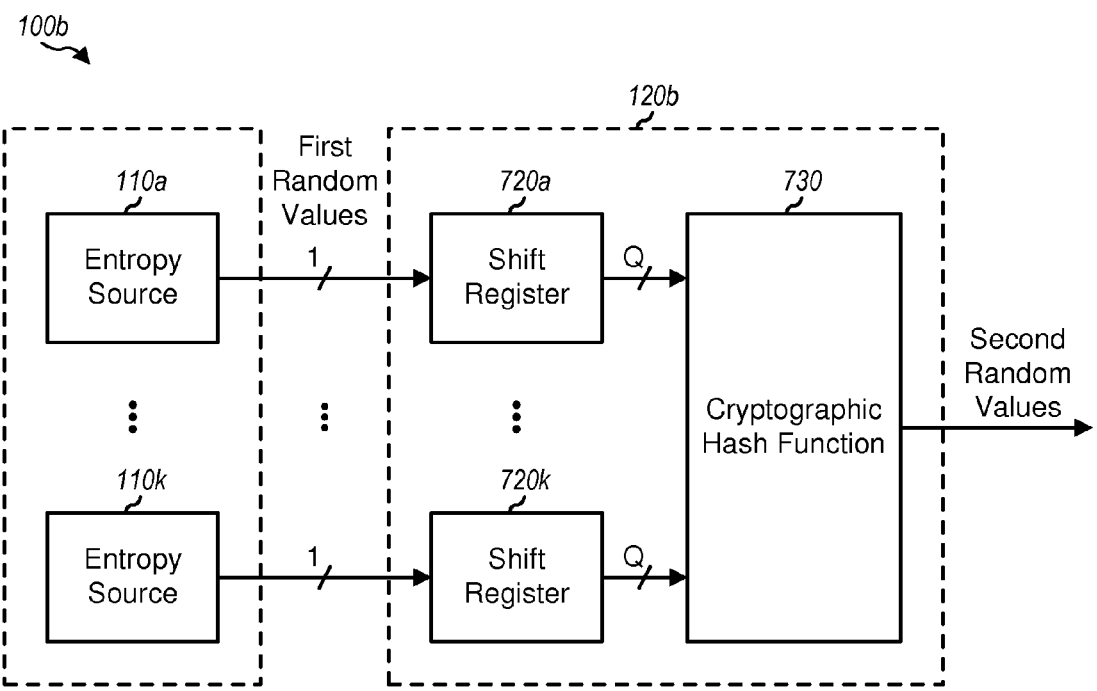

FIG. 7B shows a block diagram of a RN generator 100b, which is another design of RN generator 100 in FIG. 1. In this design, RN generator 100b includes K entropy sources 110a to 110k and a cryptographic hash module 120b, which is another design of post-processing module 120 in FIG. 1. In general, K may be any integer value greater than one. The use of multiple entropy sources may improve randomness. Each of the K entropy sources 110a to 110k may be implemented with entropy source 110x in FIG. 2A, entropy source 110y in FIG. 2B, entropy source 110z in FIG. 3, entropy source 110w in FIG. 5, or some other entropy source. Each entropy source 110 in FIG. 7B may generate a sequence of first random values (e.g., random bits) based on one or more MR elements.

Within hash module 120b, K shift registers 720a to 720k may receive the first random values from K entropy sources 110a to 110k, respectively. Each shift register 720 may aggregate each block of Q random bits from an associated entropy source 110 to form a Q-bit random value, where Q may be any integer value greater than one. Hash module 120b may receive Q-bit random values from shift registers 720a to 720k and may combine these Q-bit random values to form L-bit random values. In one design, hash module 120b may aggregate each set of K Q-bit random values from shift registers 720a to 720k to obtain one L-bit random value, where K*Q=L. In another design, hash module 120b may combine each set of K Q-bit random values from shift registers 720a to 720k with an exclusive-OR (XOR) function to obtain one L-bit random value, where Q=L. Hash module 120b may also combine each set of K Q-bit random values from shift registers 720a to 720k in other manners. In any case, a hash function 730 may hash a number of L-bit random values based on a cryptographic/secure hash algorithm and provide a N-bit hash value, where N may be any suitable integer value.

In one design, hash function 730 may have a wide input width of L bits, where L may be a block size of the hash function, which may be 256 bits for SHA-256. In another design, hash function 730 may have an input width of an integer number of bytes, e.g., 1, 2, 4 or 8 bytes. Shift registers 720 may be used to accumulate first random values (e.g., random bits) from entropy sources 110a to 110k, as shown in FIG. 7B. In yet another design, hash function 730 may directly receive the first random values from entropy sources 110a to 110k, and shift registers 720 may be omitted.

Figure 8A:
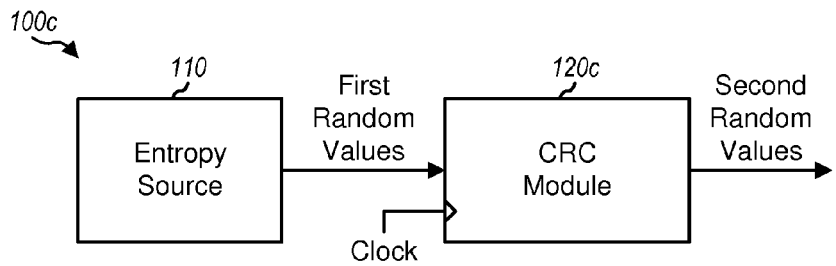

FIG. 8A shows a block diagram of a RN generator 100c, which is yet another design of RN generator 100 in FIG. 1. In this design, RN generator 100c includes entropy source 110 and a cyclic redundancy check (CRC) module 120c, which is another design of post-processing module 120 in FIG. 1. CRC module 120c receives first random values (e.g., random bits) from entropy source 110 and generates second random values. CRC module 120c may be implemented with a linear feedback shift register (LFSR) composed of R registers, where R may be any integer value. The R registers may be connected based on a generator polynomial that can provide an output having good statistical properties. In one design, the first random values may be provided to CRC module 120c in a similar manner as a data packet provided to a CRC module.

CRC module 120c may provide a N-bit second random value after a particular number of first random values have been provided to the CRC module, e.g., in a similar manner as a CRC being generated after an entire data packet has been provided to the CRC module, where N≤R. The random bits from entropy source 110 may also be used to seed a deterministic pseudo-random bit generator, or a module that generates bits based on an error detection code, or some other bit generator.

Figure 8B:
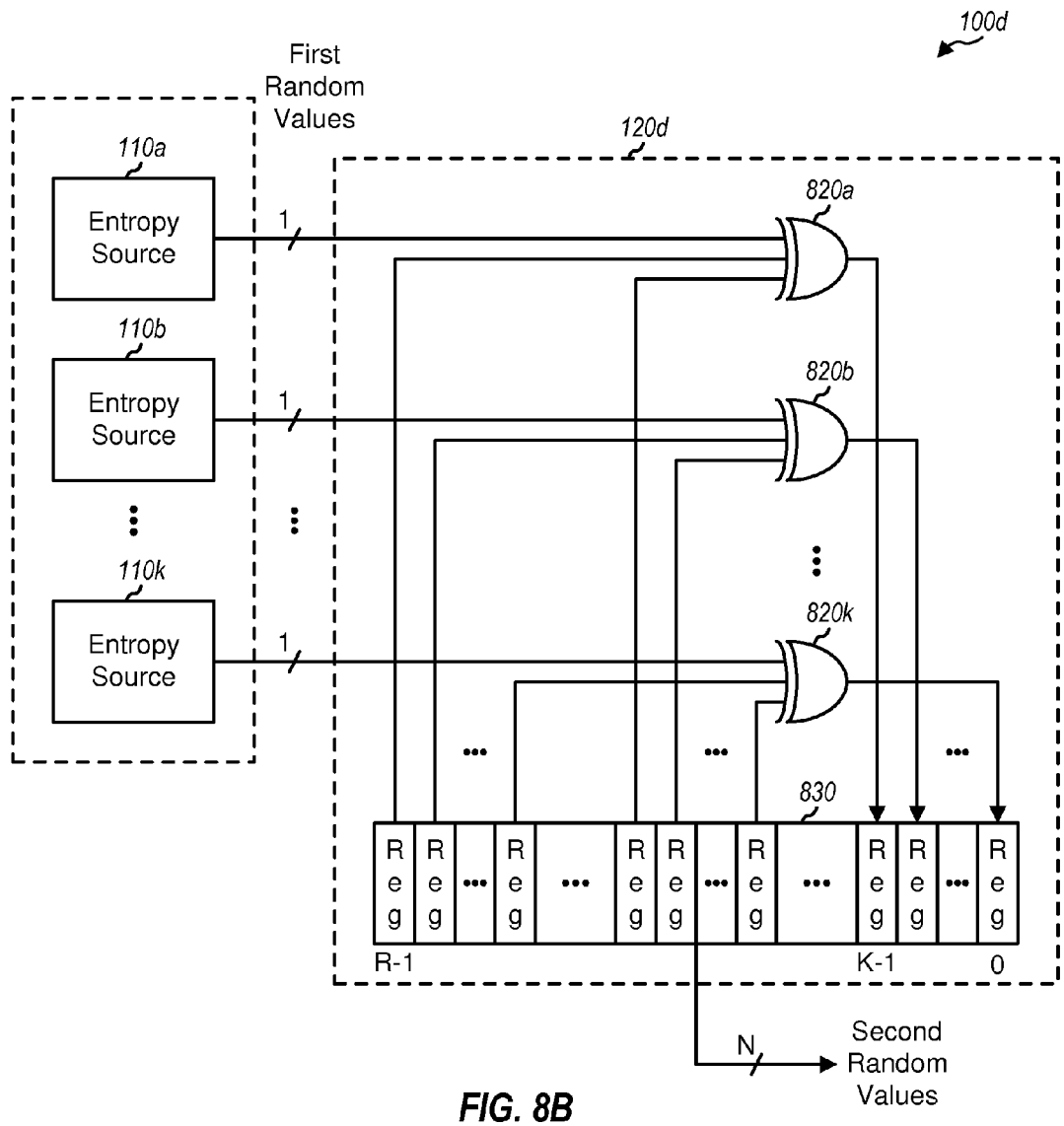

FIG. 8B shows a block diagram of a RN generator 100d, which is yet another design of RN generator 100 in FIG. 1. In this design, RN generator 100d includes multiple (K) entropy sources 110a to 110k and a CRC module 120d, which is yet another design of post-processing module 120 in FIG. 1. Each entropy source 110 may generate a sequence of first random values (e.g., random bits) based on one or more MR elements.

In the design shown in FIG. 8B, CRC module 120d includes K XOR gates 820a to 820k and a LFSR 830. LFSR 830 may include R registers coupled in series. The outputs of the R registers may be shifted to the left by K bits in each clock cycle. XOR gates 820a to 820k may receive the first random values from K entropy sources 110a to 110k, respectively. Each XOR gate 820 may also receive one or more bits in LFSR 830, with the one or more bits being determined based on a generator polynomial being implemented by CRC module 120d. Each XOR gate 820 may perform modulo-2 addition of all the input bits and provide a 1-bit output in each clock cycle. K XOR gates 820a to 820k may provide their outputs to the first K registers of LFSR 830. In one design, CRC module 120d may receive the first random values from entropy sources 110a to 110k and may provide a N-bit second random value after a particular number of first random values have been provided to the CRC module, where N≤R.

In one exemplary design, K may be equal to 4, R may be equal to 34, and N may be equal to 32. Four entropy sources 110 may provide their random bits to four XOR gates 820 within CRC module 120d. CRC module 120d may also include a 34-bit LFSR 830 and may implement the following generator polynomial:

$$x^{33}+x^{11}+1=0. \quad \text{Eq (2)}$$

In the exemplary design, the first XOR gate 820a may receive the random bits from the first entropy source 110a and also bits 10 and 33 of LFSR 830. The second XOR gate 820b may receive the random bits from the second entropy source 110b and also bits 9 and 32 of LFSR 830. The third XOR gate may receive the random bits from the third entropy source and also bits 8 and 31 of LFSR 830. The fourth XOR gate may receive the random bits from the fourth entropy source and also bits 7 and 30 of LFSR 830. The first to fourth XOR gates may provide their outputs to registers 3, 2, 1 and 0, respectively, of LFSR 830. LFSR 830 may be shifted to the left by 4 bits in each clock cycle. A 32-bit second random value may be provided by 32 registers of LFSR 830 (e.g., registers 2 to 33) in every 16 or more clock cycles (e.g., after 64 or more random bits from the four entropy sources have been provided to LFSR 830).

Figure 9:
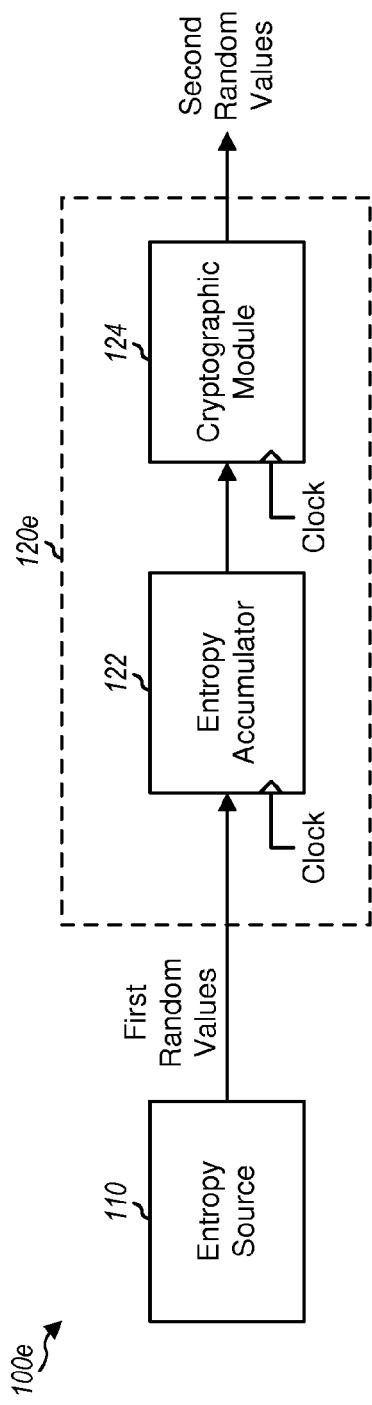

FIG. 9 shows a block diagram of a RN generator 100e, which is yet another design of RN generator 100 in FIG. 1. In this design, RN generator 100e includes entropy source 110 and a post-processing module 120e. Post-processing module 120e includes an entropy accumulator 122 and a cryptographic module 124. Entropy accumulator 122 may receive and accumulate the first random values from entropy source 110 and provide intermediate random values. Entropy accumulator 122 may perform entropy accumulation based on a polynomial generator, a code, etc. Cryptographic module 124 may receive the intermediate random values and provide second random values. Cryptographic module 124 may implement any cryptographic algorithm, such as an algorithm listed in Federal Information Processing Standards (FIPS) Special Publication 800-90 or others allowed by FIPS 140 and its annexes, which are publicly available. Cryptographic module 124 may also implement some other cryptographic algorithm known by one skilled in the art.

Figure 10:
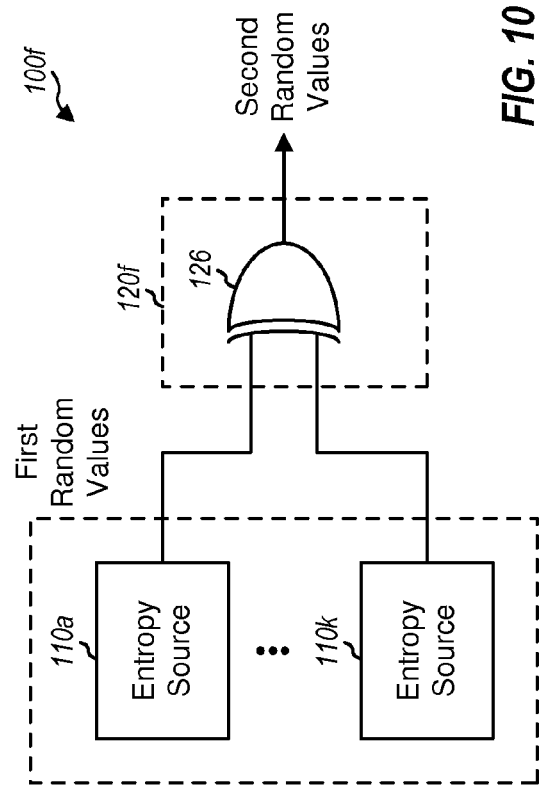

FIG. 10 shows a block diagram of a RN generator 100f, which is yet another design of RN generator 100 in FIG. 1. In this design, RN generator 100f includes K entropy sources 110a to 110k and a combiner 120f, which is yet another design of post-processing module 120 in FIG. 1. The K entropy sources 110a to 110k may generate K sequences of first random values (e.g., random bits). Combiner 120f may receive the K sequences of first random values from the K entropy sources 110a to 110k and may generate second random values. In one design that is shown in FIG. 10, combiner 120f may be implemented with an XOR gate 126 having K inputs that receive the K sequences of first random values. In another design that is not shown in FIG. 10, combiner module 120f may implement a modulo-M summer, where M may be any suitable value.

RN generator 100f may generate N-bit second random values in various manners. In one design, in each clock cycle, K first random values in the K sequences may be summed modulo-$2^N$ to obtain a N-bit second random value for that clock cycle.

For example, if N=2 and K≥4, then in each clock cycle K first random bits from the K entropy sources 110a to 110k may be summed modulo-4 to obtain a 2-bit second random value for that clock cycle. In another design, in each clock cycle, K first random values in the K sequences may be summed modulo-2 to obtain a 1-bit combined value for that clock cycle. A N-bit second random value may be formed with N combined values provided by combiner 120f in N clock cycles. Combiner 120f may also be implemented with other circuits.

Figure 11:
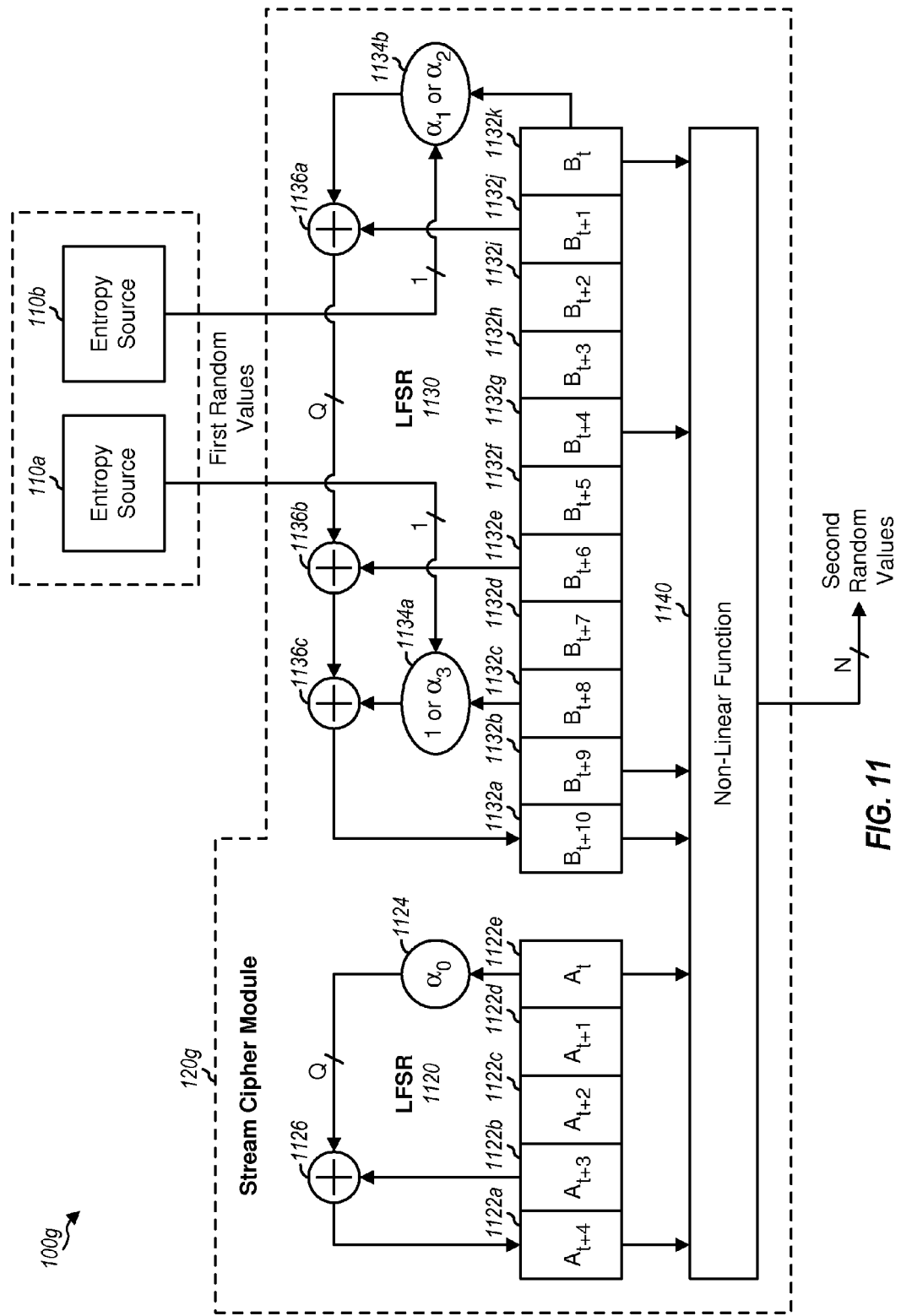

FIG. 11 shows a block diagram of a RN generator 100g, which is yet another design of RN generator 100 in FIG. 1. In this design, RN generator 100g includes two entropy sources 110a and 110b and a stream cipher module 120g, which is another design of post-processing module 120 in FIG. 1. Each entropy source 110 generates a sequence of random bits based on one or more MR elements.

Stream cipher module 120g includes two LFSRs 1120 and 1130 and a non-linear function 1140, which collectively implement a modified K2 stream cipher algorithm. LFSR 1120 implements a first generator polynomial and includes five Q-bit registers 1122a to 1122e that are coupled in series, where Q may be any integer value greater than one, e.g., Q=8, 16, 32, etc. A multiplier 1124 receives a Q-bit value from the last register 1122e and multiplies this Q-bit value with a coefficient $\alpha_0$. A summer 1126 receives Q-bit values from multiplier 1124 and register 1122b, sums the two Q-bit values based on finite field addition, and provides a Q-bit result to register 1122a. Finite field addition of two Q-bit values may be achieved by performing bit-wise XOR of the two Q-bit values. LFSR 1130 implements a second generator polynomial and includes eleven Q-bit registers 1132a to 1122k that are coupled in series. A multiplier 1134a receives a Q-bit value from register 1132c and multiplies this Q-bit value with either coefficient 1 or $\alpha_3$, which is selected based on a random bit from entropy source 110a. A multiplier 1134b receives a Q-bit value from register 1132k and multiplies this Q-bit value with coefficient $\alpha_1$ or $\alpha_2$, which is selected based on a random bit from entropy source 110b. A summer 1136a receives and sums the Q-bit values from multiplier 1134b and register 1122j. A summer 1136b receives and sums the Q-bit values from summer 1136a and register 1132e. A summer 1136c receives and sums the Q-bit values from multiplier 1134a and summer 1136b. Each summer 1136 sums its two Q-bit values based on finite field addition and provides a Q-bit result.

Non-linear function 1140 receives Q-bit values from registers 1122a and 1122e of LFSR 1120 as well as Q-bit values from registers 1132a, 1132b, 1132g and 1132k of LFSR 1130. Non-linear function 1140 processes the received Q-bit values based on a non-linear function and provides N-bit second random values. The second random values may be used as a cryptographic key for encryption, decryption, and/or other cryptographic and non-cryptographic functions. The non-linear function and the K2 stream cipher algorithm are described in detailed by Kiyomoto et al in a paper entitled "A Word-Oriented Stream Cipher Using Clock Control," which is publicly available.

In the design shown in FIG. 11, one entropy source 110a is used to dynamically select the coefficient for multiplier 1134a, and another entropy source 110b is used to dynamically select the coefficient for multiplier 1134b. In this design, the feedback polynomial for LFSR 1130 has four possible values depending on the random values from entropy sources 110a and 110b. In another design, a single entropy source may be used to select the coefficient for only multiplier 1134a, or the coefficient for only multiplier 1134b, or the coefficients for both multipliers 1134a and 1134b. For example, random bits of even indices from the entropy source may select the coefficient for multiplier 1134a, and random bits of odd indices from the entropy source may select the coefficient for multiplier 1134b. In yet another design, multiple entropy sources may be combined (e.g., XORed) and used to select the coefficient for multiplier 1134a. Alternatively or additionally, multiple entropy sources may be combined and used to select the coefficient for multiplier 1134b. The use of multiple entropy sources to select the coefficient for multiplier 1134a and/or 1134b may improve resistance to individual MR element failures and may also bring the percentage of each state '0' or '1' closer to 50%. One or more entropy sources may also be used to dynamically select the coefficients for one or more multipliers of LFSR 1130 in other manners.

Random values from one or more entropy sources may also alter the operation and/or state of LFSR 1130 in other manners. In one design, the random values may be combined (e.g., XORed) with selected bits in the LFSR. In another design, the random values may select different taps in the LFSR. In yet another design, a register (e.g., a shift register) may accept many bits from the Q entropy sources. When the register is full, each bit in a set of bits from the LFSR may be replaced with its previous value XORed with a selected bit of the register.

Figure 12:
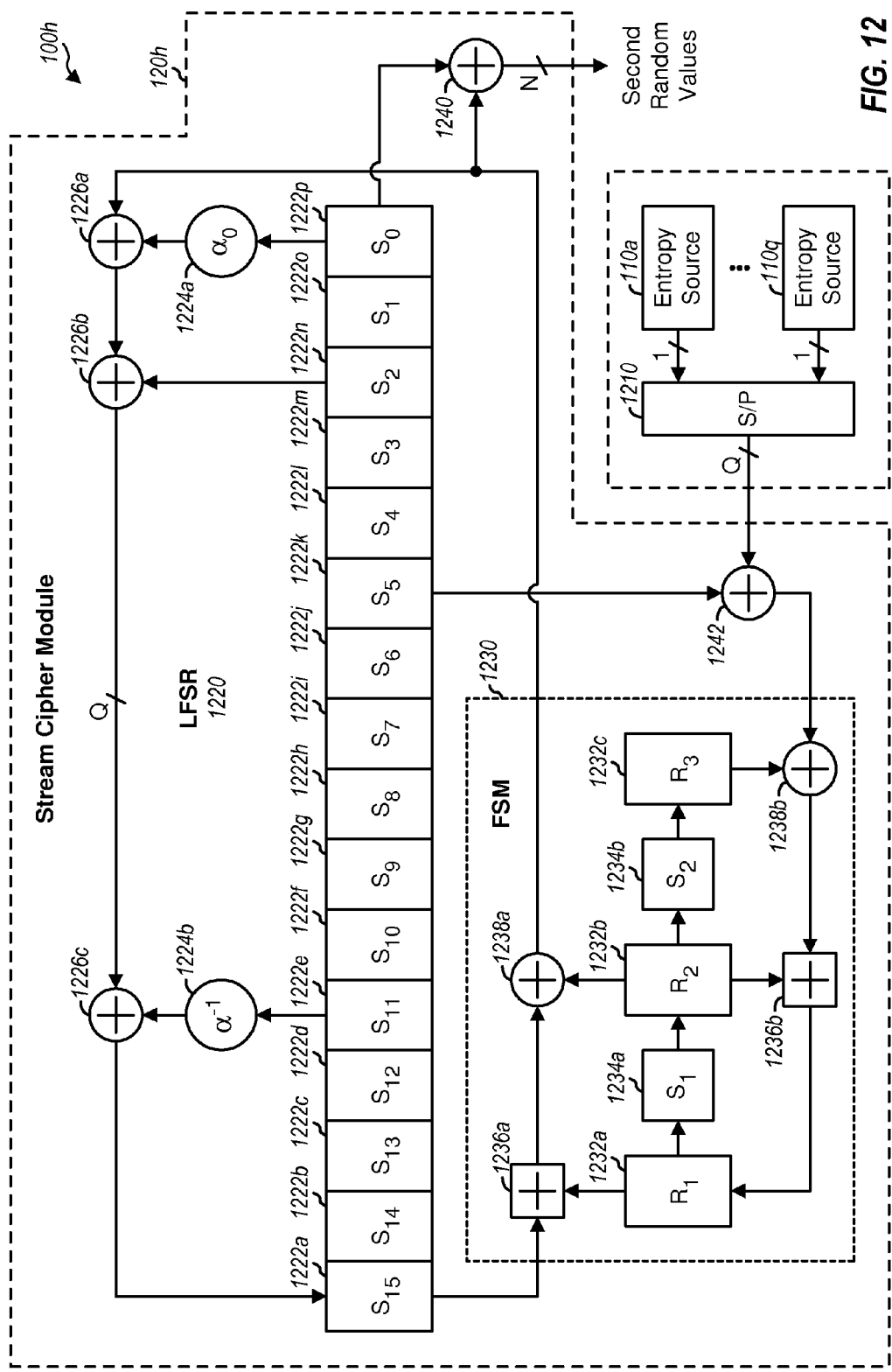

FIG. 12 shows a block diagram of a RN generator 100h, which is yet another design of RN generator 100 in FIG. 1. In this design, RN generator 100h includes Q entropy sources 110a to 110q and a stream cipher module 120h, which is another design of post-processing module 120 in FIG. 1, where Q may be any integer value greater than one. Entropy sources 110a to 110q generate Q sequences of random bits. In the design shown in FIG. 12, a serial-to-parallel (S/P) converter 1210 receives the Q sequences of random bits and provides a sequence of Q-bit random values. Each Q-bit random value may include one bit from each of the Q sequences of random bits. S/P converter 1210 may be implemented with straight through wires. In another design that is not shown in FIG. 12, S/P converter 1210 receives a single sequence of random bits from a single entropy source 110 and provides a sequence of Q-bit random values. Each Q-bit random value may be formed based on Q bits in the single sequence of random bits. In general, S/P converter 1210 may receive one or more sequence of random bits from one or more entropy sources and may provide a sequence of Q-bit random values.

Stream cipher module 120h implements a modified SNOW 3G stream cipher algorithm and includes a LFSR 1220, a finite state machine (FSM) 1230, and summers 1240 and 1242. LFSR 1220 includes 16 Q-bit registers 1222a to 1222p coupled in series and implements a generator polynomial $\alpha \cdot x^{15} + x^{13} + \alpha^{-1} \cdot x^4 + 1 = 0$. A finite-field multiplier 1224a receives a Q-bit value from the last register 1222p and multiplies this Q-bit value with a coefficient $\alpha_0$. A finite-field multiplier 1224b receives a Q-bit value from register 1222e and multiplies this Q-bit value with a coefficient $\alpha^{-1}$. A summer 1226a receives and sums Q-bit values from multiplier 1224a and FSM 1230. A summer 1226b receives and sums Q-bit values from summer 1226a and register 1222n. A summer 1226c receives and sums Q-bit values from summer 1226b and multiplier 1224b. Each summer 1226 sums its two Q-bit values based on finite field addition and provides a Q-bit result.

FSM 1230 includes three Q-bit registers 1232a to 1232c and two substitution boxes (S-boxes) 1234a and 1234b. An integer summer 1236a receives and sums Q-bit values from registers 1222a and 1232a based on addition modulo $2^Q$. A summer 1238a receives and sums Q-bit values from summer 1236a and register 1232b and provides its Q-bit output as the output of FSM 1230. Summer 1242 receives and sums Q-bit values from register 1222k and S/P converter 1210. A summer 1238b receives and sums Q-bit values from summer 1242 and register 1232c. Each of summers 1238 and 1242 sums its two Q-bit values based on finite field addition and provides a Q-bit result. An integer summer 1236b receives and sums Q-bit values from summer 1238b and register 1232b based on addition modulo $2^Q$ and provides its Q-bit output to register 1232a. Summer 1240 sums the Q-bit values from register 1222p and FSM 1230 and provides N-bit second random values, where N≤Q. S-box 1234a receives the output of register 1232a and provides an input to register 1232b. S-box 1234b receives the output of register 1232b and provides an input to register 1232c. Each S-box 1234 maps a Q-bit input to a Q-bit output based on a predefined function.

In one design, FSM 1230 and summer 1242 may be operated for a number of clock cycles to initialize LFSR 1220. LFSR, FSM 1230, and summer 1240 may then be operated to generate the second random values. RN generator 100h may also be operated in other manners.

In one design, entropy sources 110 and S/P converter 1210 may operate based on the same clock used for LFSR 1220 and FSM 1230. In another design, LFSR 1220 and FSM 1230 may operate based on a first clock, and entropy sources 110 and S/P converter 1210 may operate based on a second clock that is faster than the first clock. This design may be especially applicable if each clock cycle steps LFSR 1220 and FSM 1230 one time.

FIGS. 11 and 12 show two examples of continually injecting entropy into a RN generator. In FIG. 11, RN generator 100g accepts two random bits and provides 32 random bits. Hence, RN generator 100g does not qualify as a non-deterministic random bit generator (NRBG) according to NIST definition. In FIG. 12, RN generator 100h accepts entropy from MR devices that is approximately equal to the rate of the output. Hence, RN generator $100h$ may qualify as a NRBG according to NIST definition.

FIGS. 11 and 12 show two designs of modifying an internal state of two exemplary cryptographic functions (e.g., stream cipher algorithms) based on one or more entropy sources, where each entropy source may include one or more MR elements. The operation of cryptographic functions may also be modified based on one or more entropy sources in other manners besides the specific examples given in FIGS. 11 and 12. Entropy sources may also be used to modify the internal state and/or the operation of other cryptographic functions.

Various exemplary designs of post-processing module 120 have been described above. In general, post-processing circuit 120 may receive first random values serially from a single entropy source (e.g., as shown in FIG. 7A, 8A, or 9) or in parallel from multiple entropy sources (e.g., as shown in FIG. 7B, 8B, 10, 11 or 12). Post-processing module 120 may be an entropy extractor that can combine the first random values statistically or computationally. A statistical entropy extractor may operate based on assumptions of a model (e.g., assumptions that instances of certain events are independent and identically distributed) and may produce random values that are unbiased and uncorrelated and statistically indistinguishable from a true random source. A computational entropy extractor may feed the first random values into a function, such as a hash function, and may present the output as a block of random bits. If the selected hash function closely approximates an ideal hash function, then the computational entropy extractor should be able to generate second random values that are indistinguishable from a true random source based on the first random values derived from one or more MR elements.

In another aspect, a detection circuit may be used to detect tampering with an entropy source comprising one or more MR elements. A MR element has a variable resistance that changes based on magnetic field. For example, the resistance of a STT-MTJ device can change based on the relative magnetization of the two layers of magnetic material, as described above. A MR element may be subject to tampering, e.g., with a magnet placed in close proximity to the MR element. Tampering with the MR element may be detected as described below.

Figure 13:
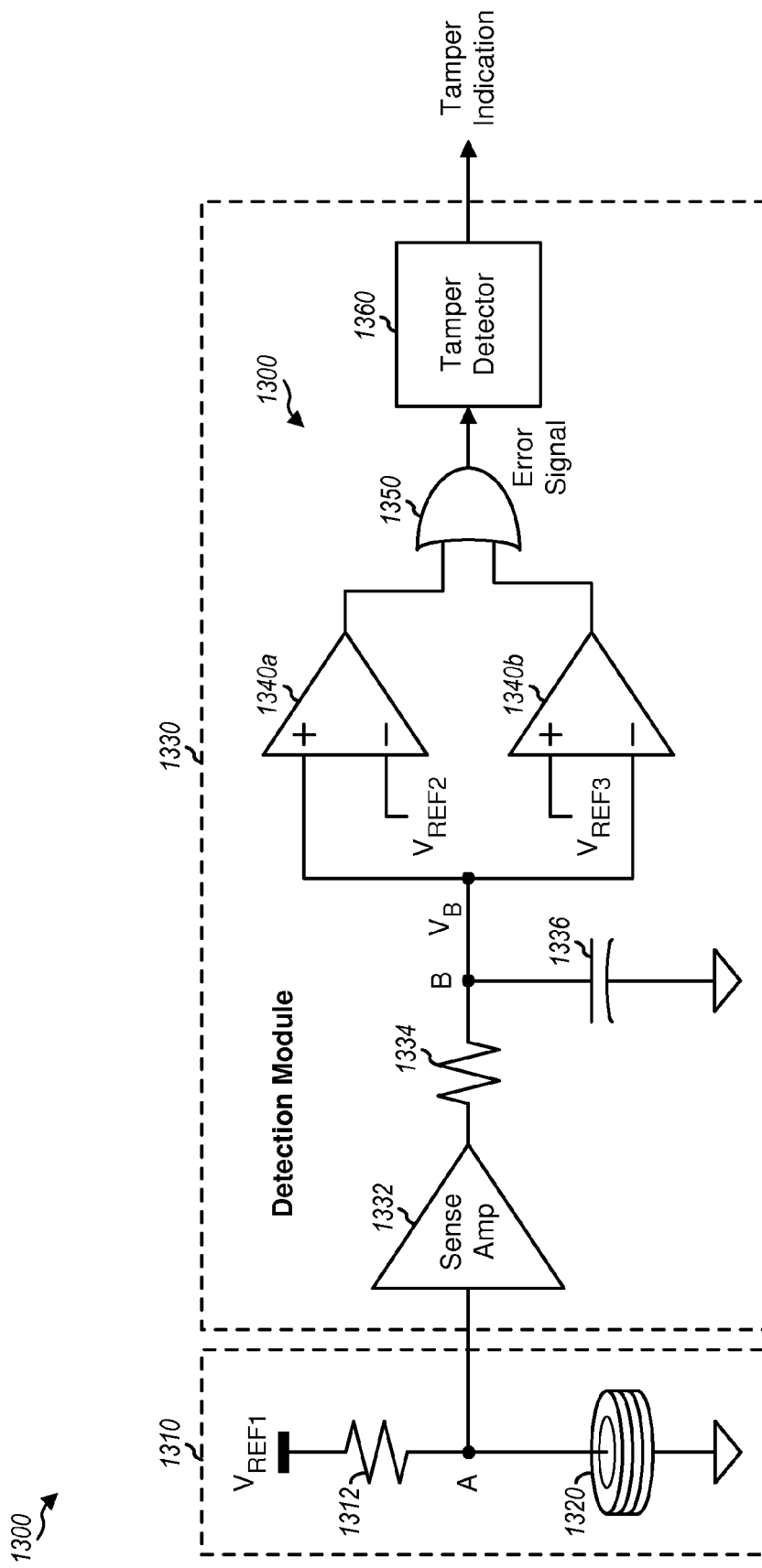
FIG. 13 shows a tamper detection circuit.

FIG. 13 shows a schematic diagram of an analog tamper detection circuit 1300 that may be used to detect tampering with a MR element 1320. Tamper detection circuit 1300 includes an entropy source 1310 and a detection module 1330. Within entropy source 1310, a resistor 1312 has one end coupled to a first reference voltage ($V_{REF1}$) and the other end coupled to node A. MR element 1320 has one end coupled to node A and the other end coupled to circuit ground.

Within detection module 1330, a sense amplifier 1332 has its input coupled to node A and its output coupled to one end of a resistor 1334. Sense amplifier 1332 may also receive a reference voltage, as shown in FIG. 2A or 2B but not shown in FIG. 13 for simplicity. The other end of resistor 1334 is coupled to node B. A capacitor 1336 is coupled between node B and circuit ground. A first comparator 1340a has its non-inverting input coupled to node B, its inverting input receiving a second reference voltage ($V_{REF2}$), and its output coupled to a first input of an OR gate 1350. A second comparator 1340b has its inverting input coupled to node B, its non-inverting input receiving a third reference voltage ($V_{REF3}$), and its output coupled to a second input of OR gate 1350. OR gate 1350 provides an error signal. The $V_{REF2}$ voltage is higher than the $V_{REF3}$ voltage. The $V_{REF2}$ and $V_{REF3}$ voltages define a target range of resistance values for MR element 1320 under normal operation. A tamper detector 1360 receives the error signal from OR gate 1350, determines whether MR element 1320 has been tampered as described below, and provides a tamper indication.

Sense amplifier 1332 senses the voltage at node A ($V_A$), which is dependent on the resistance of MR element 1320. The sensed voltage is filtered by a lowpass filter composed of resistor 1334 and capacitor 1336. The filtered voltage at node B ($V_B$) is compared against the $V_{REF2}$ voltage by comparator 1340a and is also compared against the $V_{REF3}$ voltage by comparator 1340b. The error signal is at logic high when the output of either comparator 1340a or 1340b is high.

MR element 1320 is used as a sensor to detect external attempts to manipulate the operation of the MR element, e.g., with a strong magnetic field or temperature. In one design, MR element 1320 may be different from a MR element used in an entropy source. In another design, a MR element used in an entropy source may also be used as MR element 1320 in tamper detection circuit 1300. In any case, the $V_B$ voltage is linearly related to the duty cycle of the output of sense amplifier 1332, with the duty cycle being dependent on the fraction of output bits that are "1". Comparator 1340a detects whether the duty cycle exceeds a high threshold determined by the $V_{REF2}$ voltage. Comparator 1340b detects whether the duty cycle is below a low threshold determined by the $V_{REF3}$ voltage. The error signal is at logic high when the duty cycle is not within the high and low thresholds. Although not shown in FIG. 13, the output of OR gate 1350 may be provided to a flip-flop, which may provide the error signal. In any case, the error signal may include a sequence of ones and zeros determined based on the detected duty cycle, which is dependent on the sensed resistance of MR element 1320.

Module 1360 may detect tampering with MR element 1320 based on the error signal in various manners. In one design, module 1360 may count runs of ones and runs of zeros in the error signal over a predetermined time interval. Module 1360 may declare tampering if the count of runs of ones or the count of runs of zeros is either too small or too large. In another design, module 1360 may count the number of occurrences of predetermined patterns (e.g., patterns of '11', '10', '01', and '11') over a predetermined time interval. Module 1360 may declare tampering if the count of any pattern is too small or too large. In yet another design, module 1360 may provide the sequence of ones and zeros in the error signal to a compression algorithm. Module 1360 may declare tampering if the output rate of the compression algorithm is too small. Module 1360 may also detect tampering with MR element 1320 based on the error signal in other manners.

In another design, the output of sense amplifier 1332 may be digitized, e.g., with a flip-flop connected to the output of sense amplifier 1332. The digitized output of sense amplifier 1332 may be filtered with an analog lowpass filter, which may be formed with resistor 1334 and capacitor 1336. The lowpass filter may perform averaging of the digitized output. Comparators 1340a and 1340b may compare the filtered signal against high and low thresholds. The error signal from OR gate 1350 may be set to logic high, which indicated tampering, if the filtered signal is above the high threshold or below the low threshold.

Entropy source $110c$ in FIG. 3 (with or without a feedback circuit) may also be used to detect tampering. For example, the ratio of '1' to '0' values provided by sense amplifier 330 may be determined and compared against a low threshold and a high threshold. The high and low thresholds may be defined based on a window of allowed values for the ratio, which should be centered around 50%. Tampering may be detected when the ratio exceeds the high threshold or falls below the low threshold.

In one design, an apparatus (e.g., an IC, a wireless device, an electronics module, etc.) may include a MR element and a sensing circuit, e.g., as shown in FIG. 2A or 2B. The MR element (e.g., MR element 210) may be applied with a static current and may have a variable resistance determined based on magnetization of the MR element. The MR element may comprise a STT-MTJ device or some other type of device having a variable resistance versus magnetization. The sensing circuit may sense the resistance of the MR element and provide random values based on the sensed resistance of the MR element.

In one design, the sensing circuit may comprise a sense amplifier (e.g., sense amplifier 240 in FIG. 2A) having a first input coupled to the MR element, a second input receiving a reference voltage, and an output providing sensed values used to generate the first random values. The sensing circuit may further comprise a resistor (e.g., resistor 210) coupled in series with the MR element, with the combination of the resistor and the MR element forming a resistive voltage divider. In one design, the reference voltage (e.g., the $V_{REF2}$ voltage in FIG. 2A) may be generated by a reference voltage generator. In another design, the reference voltage (e.g., the $V_Y$ voltage in FIG. 2B) may be generated based on a resistive voltage divider, which may form a bridge circuit with the MR element and may be used to measure the resistance of the MR element (e.g., as shown in FIG. 2B). In yet another design, a second MR element may be coupled to the second input of the sense amplifier and may be used to generate the reference voltage.

In one design, a resistor (e.g., resistor 210) may be coupled between the MR element and a voltage and may provide the static current for the MR element (e.g., as shown in FIGS. 2A and 2B). In another design, a current source may be coupled to the MR element and may provide the static current for the MR element.

In one design, the sensing circuit may further comprise a flip-flop (e.g., flip-flop 250) coupled to the sense amplifier. The flip-flop may receive the sensed values from the sense amplifier and provide the random values. Latching the sensed values with the flip-flop may ensure that the random values can meet setup times and hold times of digital circuits receiving the random values.

In one design, at least one additional MR element may be coupled in series (e.g., as shown in FIG. 6B) or in parallel (e.g., as shown in FIG. 6C) with the MR element. The use of multiple MR elements may improve entropy generation as well as reliability.

In another design, an apparatus (e.g., an IC, a wireless device, an electronics module, etc.) may include an entropy source and a post-processing module, e.g., as shown in FIG. 1. The entropy source may comprise at least one MR element and may provide first random values based on the at least one MR element. The post-processing module may receive and process the first random values and provide second random values.

In one design, the post-processing module may receive a single sequence of first random values from a single entropy source and may generate the second random values based on this single sequence of first random values. In another design, the post-processing module may receive a plurality of sequences of first random values from a plurality of entropy sources and may generate the second random values based on the plurality of sequences of first random values.

In one design, the post-processing module may hash the first random values (e.g., based on a cryptographic hash function as shown in FIG. 7A) and provide the second random values. In another design, the post-processing module may include a plurality of shift registers and a hash module, e.g., as shown in FIG. 7B. The plurality of shift registers may receive a plurality of sequences of first random values from a plurality of entropy sources including the entropy source. The hash module may receive a plurality of sequences of intermediate values from the plurality of shift registers, hash the intermediate values, and provide the second random values. Each first random value may comprise a 1-bit value, each intermediate value may comprise a Q-bit value, and each second random value may comprise a N-bit value, where Q and N may be greater than one. In one design, the total number of bits of each second random value may be less than the total number of bits of all first random values used to generate the second random value, so that the total number of input bits is greater than the total number of output bits.

In yet another design, the post-processing module may generate the second random values based on the first random values and an error detection code, e.g., a CRC as shown in FIG. 8A. The post-processing module may include a LFSR implementing a generator polynomial. The LFSR may receive the first random values and provide the second random values.

In yet another design, the post-processing module may include a plurality of registers (e.g., registers 830 in FIG. 8B) coupled in series and at least two combiners. Each combiner may be an XOR gate (e.g., as shown in FIG. 8B), a modulo-2 adder, etc. The at least two combiners may be coupled to at least two registers in the plurality of registers and may receive at least two sequences of first random values from at least two entropy sources. The plurality of registers and the at least two combiners may implement a generator polynomial with at least two feedback bits.

In yet another design, the post-processing module may include an entropy accumulator and a cryptographic module, e.g., as shown in FIG. 9. The entropy accumulator may receive the first random values and provide intermediate random values. The cryptographic module may receive the intermediate random values and provide second random values. The cryptographic module may generate the second random values based on a cryptographic hash function, a stream cipher algorithm, etc.

In yet another design, the post-processing module may include a combiner. The combiner may comprise an XOR gate as shown in FIG. 10, or a modulo-M summer, where M is an integer greater than one, or some other circuit. The combiner may receive and process a plurality of sequences of first random values from a plurality of entropy sources and provide the second random values. The combiner may perform modulo-M summation of a plurality of first random values in the plurality of sequences of first random values to obtain a corresponding second random value.

In yet another design, the post-processing module may include a stream cipher generator, e.g., as shown in FIG. 11 or 12. The stream cipher generator may generate the second random values. The first random values may alter the operation and/or the internal state of the stream cipher generator. In one design, the stream cipher generator may generate the second random values based on a K2 stream cipher algorithm, e.g., as shown in FIG. 11. The first random values may select coefficients of the K2 stream cipher algorithm. In another design, the stream cipher generator may generate the second random values based on a SNOW 3G stream cipher algorithm, e.g., as shown in FIG. 12. The first random values may change the internal state of the SNOW 3G stream cipher algorithm.

In one design, the entropy source may be a low-energy entropy source and may comprise a biasing circuit and a sensing circuit, e.g., as shown in FIG. 2A or 2B. The biasing circuit (e.g., resistor 210) may provide a static current for the at least one MR element. The sensing circuit (e.g., sensing circuit 230) may sense the resistance of the at least one MR element and provide the first random values based on the sensed resistance. In another design, the entropy source may be a high-energy entropy source and may comprise a control circuit and a sensing circuit, e.g., as shown in FIG. 3. The control circuit may generate current or voltage pulses to change the state of the at least one MR element. The sensing circuit may sense the resistance of the at least one MR element and provide random values based on the sensed resistance.

In one design, the first random values may comprise 1-bit values, and the second random values may comprise multi-bit values. In general, the first and second random values may each comprise a value of any number of bits.

The entropy source may be implemented in hardware, e.g., on an IC, an electronics module, etc. The post-processing module may be implemented in hardware, software, and/or firmware in various manners, as described below.

In yet another design, an apparatus (e.g., an IC, a wireless device, an electronics module, etc.) may include an array of MR cells, a sensing circuit, and a plurality of programming sources, e.g., as shown in FIG. 5. The array of MR cells (e.g., MR array 510) may be arranged in a plurality of rows and a plurality of columns A plurality of word lines may be coupled to the plurality of rows of MR cells. A plurality of select lines may be coupled to the plurality of columns of MR cells. A plurality of bit lines may also be coupled to the plurality of columns of MR cells. The sensing circuit (e.g., sensing circuit 550) may be coupled to the plurality of select lines and may sense the resistance of a selected MR cell in the array and provide random values. The plurality of programming sources (e.g., programming sources 532 and 534) may be coupled to the plurality of select lines and may provide pulses to change the state of the MR cells in the array. The plurality of programming sources may include (i) a first programming source (e.g., programming source 532*a*) coupled to the selected MR cell when the selected MR cell is to be switched in a first direction and (ii) a second programming source (e.g., programming source 534*a*) coupled to the selected MR cell when the selected MR cell is to be switched in a second direction.

Each MR cell may include at least one MR element. In one design, each MR cell may include a single MR element, e.g., as shown in FIG. 6A. In another design, each MR cell may include a plurality of MR elements coupled in series (e.g., as shown in FIG. 6B) or in parallel (e.g., as shown in FIG. 6C). In one design, the MR cells in the array may comprise identical MR elements. In another design, the MR cells in the array may comprise MR elements of different designs, shapes, sizes, thickness, etc. in order to improve IC yield.

In one design, the selected MR cell may be programmed in a single operation and may be applied with a current pulse or a voltage pulse from the first or second programming source in the single operation. In another design, the selected MR cell may be programmed in a plurality of operations and may be applied with a current pulse or a voltage pulse from the first or second programming source in each operation. In one design, at least one MR cell may be used to provide a reference voltage for the sensing circuit.

The plurality of programming sources may provide current pulses or voltage sources to change the state of the MR cells in the array. In one design, at least one of the first and second programming sources may provide pulses of a variable amplitude determined based on a target switching probability of the selected MR cell. In another design, at least one of the first and second programming sources may provide pulses of a variable duration determined based on the target switching probability. In yet another design, at least one of the first and second programming sources may provide pulses of a variable amplitude and a variable duration determined based on the target switching probability. In one design, the plurality of programming sources may have individually configured pulse amplitude and/or pulse duration.

In one design, the MR cells in the array may be selected and sensed at a first rate to generate random values at a second rate, which may be higher than the first rate. The MR cells may be interlaced to obtain random values at a higher rate.

In yet another design, an apparatus (e.g., an IC, a wireless device, an electronics module, etc.) may include an entropy source and a detection module, e.g., as shown in FIG. 13. The entropy source may include at least one MR element (e.g., at least one STT-MTJ device) and may provide first values based on the at least one MR element. The detection module may receive and process the first values and may provide an indication of tampering with the entropy source.

The detection module may detect tampering in various manners. In one design, the detection module may detect tampering with the entropy source based on the percentage of zeros and ones in the first values. In another design, the detection module may detect tampering with the entropy source based on runs of zeros and runs of ones in the first values. In yet another design, the detection module may detect tampering with the entropy source based on the number of occurrences of predetermined patterns of zeros and ones. In yet another design, the detection module may perform compression of the first values and may detect tampering with the entropy source based on an output rate of the compression. The detection module may also detect tampering in other manners.

Figure 14:
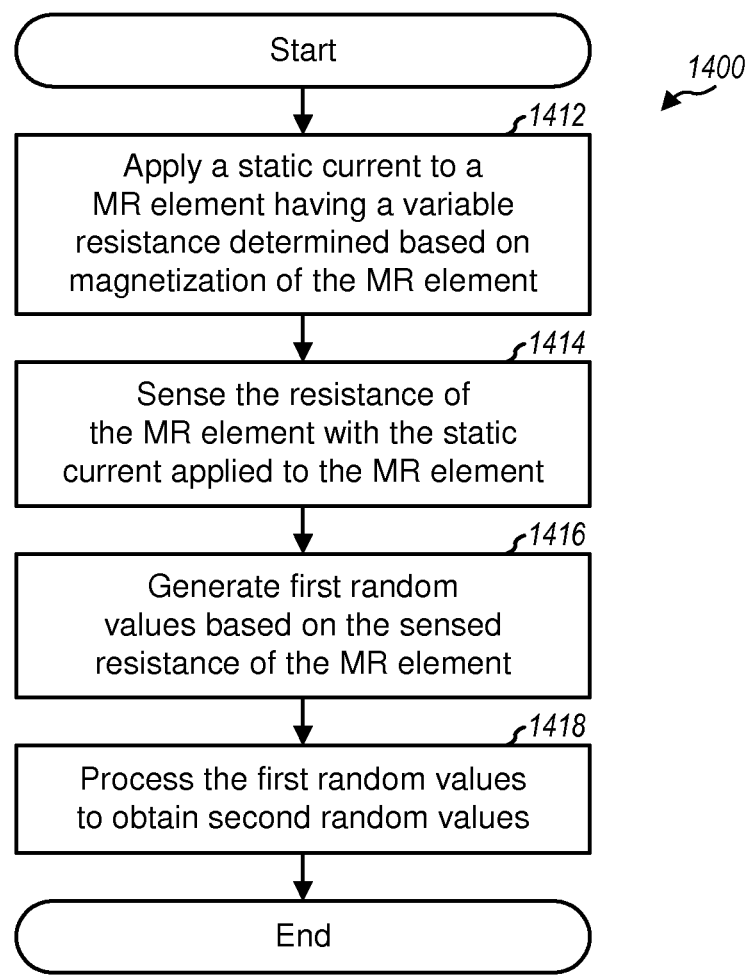
FIG. 14 shows a process for generating random values.

FIG. 14 shows a design of a process 1400 for generating random values. A static current may be applied to a MR element having a variable resistance determined based on magnetization of the MR element (block 1412). The resistance of the MR element may be sensed with the static current applied to the MR element (block 1414). First random values may be generated based on the sensed resistance of the MR element (block 1416). In one design of blocks 1414 and 1416, the resistance of the MR element may be compared against a reference value to obtain sensed values. The sensed values may then be latched to obtain the first random values.

The first random values may be used directly by an application requiring random values. Alternatively, the first random values may be processed to obtain second random values (block 1418). For example, the first random values may be processed based on a cryptographic hash function, an error detection code, a stream cipher algorithm, etc.

In one design, a plurality of sequences of first random values may be generated by sensing the resistance of a plurality of MR elements including the MR element. The plurality of sequences of first random values may be processed (e.g., with a hash function as shown in FIG. 7B, an error detection code as shown in FIG. 8B, or a combiner as shown in FIG. 10) to obtain second random values.

The first random values from an entropy source comprising at least one MR element may have one or more of the following characteristics:

Some unpredictability, even with unlimited computational power,
Unknown to adversary,
Not influenced by adversary,
Not necessarily unbiased or uncorrelated, and
Entropy may be less than output bit rate.

The second random values from a RN generator comprising an entropy source and a post-processing module may have one or more of the following characteristics:
Unpredictable, even with unlimited computational power,
Unknown to adversary,
Not influenced by adversary,
Negligible bias and correlation, and
Entropy equal to or very close to output bit rate.

The use of at least one MR element to generate first random values for a RN generator may provide various advantages. First, a MR element may have better characteristics than other sources of entropy and may be used to build a good entropy source. Changes in the resistance of the MR element form a stochastic process. The MR element may be characterized by a simple verifiable model based on physics of the MR element. Parameters of the model may be estimated based on measurements of the MR element. The MR element may be verified to obey the model based on measurements, computer simulation, etc. An entropy source may be built with the MR element without the use of high-gain devices (except for a sense amplifier to sense resistance). The entropy source may be low cost and low power, may occupy a small circuit area, and may be easily fabricated on semiconductor devices. The entropy source may have a fast generation rate and may be able to provide first random values at a high rate, possibly in the GHz range. The first random values from the entropy source may be conditioned or post-processed to improve randomness.

An entropy source and a RN generator comprising at least one MR element may be used in various electronics devices, as described above. The use of the entropy source and the RN generator in a wireless device is described below.

Figure 15:
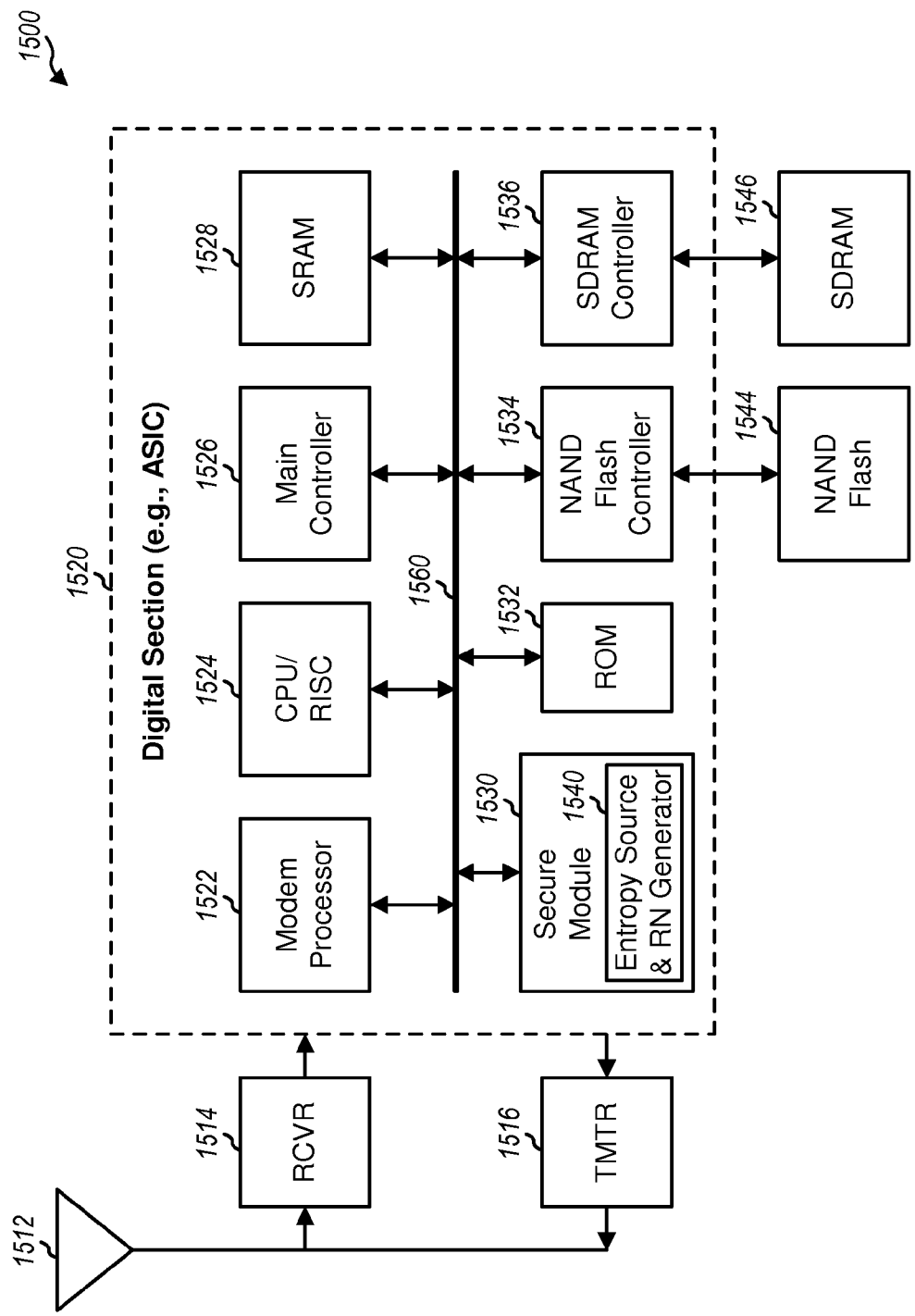
FIG. 15 shows a block diagram of a wireless device.

FIG. 15 shows a block diagram of a wireless device 1500, which may include one or more entropy sources and/or one or more RN generators. Wireless device 1500 may be a cellular phone, a smart phone, a tablet, a PDA, a laptop computer, a netbook, a smartbook, a terminal, a handset, etc. Wireless device 1500 may support communication via one or more wireless communication networks, which may include a Code Division Multiple Access (CDMA) network, a Global System for Mobile Communications (GSM) network, a Long Term Evolution (LTE) network, a wireless local area network (WLAN), etc.

Wireless device 1500 can support bi-directional communication via a receive path and a transmit path. In the receive path, signals transmitted by base stations and/or other devices may be received by an antenna 1512 and provided to a receiver (RCVR) 1514. Receiver 1514 may condition and digitize a received signal and provide input samples to a digital section 1520 for further processing. In the transmit path, a transmitter (TMTR) 1516 may receive data to be transmitted from digital section 1520. Transmitter 1516 may process and condition the data and may generate a modulated signal, which may be transmitted via antenna 1512 to base stations and/or other devices.

Digital section 1520 may include various processing, interface, and memory modules such as, for example, a modem processor 1522, a central processing unit (CPU)/reduced instruction set computer (RISC) 1524, a main controller 1526, a static random access memory (SRAM) 1528, a secure module 1530, a read-only memory (ROM) 1532, a NAND Flash controller 1534, and a synchronous dynamic RAM (SDRAM) controller 1536, all of which may communicate with one another via one or more buses 1560. Modem processor 1522 may perform processing for data transmission and reception, e.g., encoding, modulation, demodulation, decoding, etc. CPU/RISC 1524 may perform general-purpose processing for various applications such as, e.g., voice call, web browsing, multi-media, games, user interface, positioning, etc. Main controller 1526 may direct the operation of various units within digital section 1520. SRAM 1528 may store program codes and data used by the controllers and processors within digital section 1520. ROM 1532 may store a boot code and/or other code and data for wireless device 1500. NAND Flash controller 1534 may facilitate transfer of data between a NAND Flash 1544 and digital section 1520. SDRAM controller 1536 may facilitate transfer of data between a SDRAM 1546 and digital section 1520.

Secure module 1530 may securely store sensitive information (e.g., personal information, business information, passwords, etc.) and/or other information for device 1500. Secure module 1530 may include an entropy source and/or RN generator 1540 to generate random values. RN generator 1540 may include a post-processing circuit to receive first random values from entropy source 1540 and generate second random values. Secure module 1530 may implement cryptographic algorithms that may use the random values generated by entropy source and/or RN generator 1540. Secure module 1530 may also provide random values to other modules within wireless device 1500. Other modules and processors within wireless device 1500 may also include entropy sources and/or RN generators to generate random values. Processors such as processor 1524 may also include a RN generator (e.g., for software running on the processor to use).

In general, digital section 1520 may include any number of processing, interface, and memory modules. Digital section 1520 may also be implemented with one or more digital signal processors (DSPs), micro-processors, RISC processors, etc. Digital section 1520 may be fabricated on one or more application specific integrated circuits (ASICs) and/or some other type of integrated circuits (ICs).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a DSP, an ASIC, a field programmable gate array (FPGA)

or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. An apparatus comprising:
    a magneto-resistive (MR) element configured to be applied with a static current and have a resistance determined based on magnetization of the MR element, wherein the resistance of the MR element varies while the static current is applied, and wherein the static current has a constant amplitude and polarity and is free of current pulses; and
    a sensing circuit configured to sense the resistance of the MR element while the static current is applied to MR element and to provide random values based on the sensed resistance of the MR element.

2. The apparatus of claim 1, the MR element comprising a spin torque transfer (STT) magnetic tunnel junction (MTJ) device.

3. The apparatus of claim 1, the sensing circuit comprising: a sense amplifier having a first input coupled to the MR element, a second input receiving a reference voltage, and an output providing sensed values used to generate first random values.

4. The apparatus of claim 3, further comprising:
    a resistor coupled in series with the MR element, and resistor and the MR element forming a resistive voltage divider.

5. The apparatus of claim 3, further comprising:
    a second MR element coupled to the second input of the sense amplifier.

6. The apparatus of claim 5, wherein the MR element and the second MR element have different shapes, or different sizes, or different thickness, or a combination thereof.

7. The apparatus of claim 3, further comprising:
    a current source coupled to the MR element and configured to provide the static current used to measure the resistance of the MR element.

8. The apparatus of claim 3, the sensing circuit further comprising:
    a flip-flop coupled to the sense amplifier and configured to receive the sensed values and provide the random values.

9. The apparatus of claim 1, further comprising:
    at least one additional MR element coupled in series or in parallel with the MR element.

10. A method of generating random values, comprising:
    applying a static current to a magneto-resistive (MR) element having a resistance determined based on magnetization of the MR element, wherein the resistance of the MR element varies while the static current is being applied, the static current having a constant amplitude and polarity and being free of current pulses;
    sensing the resistance of the MR element while the static current is applied to the MR element; and
    generating first random values based on the sensed resistance of the MR element.

11. The method of claim 10, wherein the sensing the resistance of the MR element comprises comparing the resistance of the MR element against a reference value to obtain sensed values, and wherein the generating the first random values comprises latching the sensed values to obtain the first random values.

12. The method of claim 10, further comprising: processing the first random values to obtain second random values.

13. The method of claim 12, wherein the processing the first random values comprising processing the first random values based on at least one of a cryptographic hash function, an error detection code, or a stream cipher algorithm.

14. The method of claim 10, further comprising:
generating a plurality of sequences of first random values by sensing resistance of a plurality of MR elements including the MR element; and
processing the plurality of sequences of first random values to obtain second random values.

15. The method of claim 10, further comprising:
detecting tampering with the MR element.

16. An apparatus comprising:
means for applying a static current to a magneto-resistive (MR) element having a resistance determined based on magnetization of the MR element, wherein the resistance of the MR element varies while the static current is being applied, the static current having a constant amplitude and polarity and being free of current pulses;
means for sensing the resistance of the MR element while the static current is applied to the MR element; and
means for generating first random values based on the sensed resistance of the MR element.

17. The apparatus of claim 16, further comprising:
means for processing the first random values to obtain second random values.

18. The apparatus of claim 16, further comprising:
means for generating a plurality of sequences of first random values by sensing resistance of a plurality of MR elements including the MR element; and
means for processing the plurality of sequences of first random values to obtain second random values.

19. A non-transitory computer-readable medium comprising:
code for causing at least one processor to direct application of a static current to a magneto-resistive (MR) element having a resistance determined based on magnetization of the MR element, wherein the resistance of the MR element varies while the static current is being applied, the static current having a constant amplitude and polarity and being free of current pulses;
code for causing the at least one processor to direct sensing of the resistance of the MR element while the static current is applied to the MR element; and
code for causing the at least one processor to direct generation of first random values based on the sensed resistance of the MR element.

* * * * *